United States Patent
Kanamoto et al.

(10) Patent No.: US 7,432,581 B2
(45) Date of Patent: Oct. 7, 2008

(54) SEMICONDUCTOR DEVICE, METHOD OF MANUFACTURE THEREOF AND SEMICONDUCTOR INTEGRATED CIRCUIT

(75) Inventors: Toshiki Kanamoto, Tokyo (JP); Masumi Yoshida, Tokyo (JP); Tetsuya Watanabe, Tokyo (JP); Takashi Ippoushi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 190 days.

(21) Appl. No.: 11/336,874

(22) Filed: Jan. 23, 2006

(65) Prior Publication Data

US 2006/0170052 A1 Aug. 3, 2006

(30) Foreign Application Priority Data

Jan. 31, 2005 (JP) ............................. 2005-022806
Dec. 8, 2005 (JP) ............................. 2005-354478

(51) Int. Cl.
*H01L 29/93* (2006.01)
(52) U.S. Cl. ........................................ 257/550; 257/554
(58) Field of Classification Search ................. 257/550, 257/554
See application file for complete search history.

(56) References Cited

U.S. PATENT DOCUMENTS 5,612,564 A * 3/1997 Fujishima et al. ............ 257/341
6,740,958 B2 * 5/2004 Nakazato et al. ............ 257/550
6,864,559 B2 * 3/2005 Nakazato et al. ............ 257/550
7,122,859 B2 * 10/2006 Shimotsusa .................. 257/336
2002/0125511 A1 * 9/2002 Shimotsusa .................. 257/288
2003/0178699 A1 * 9/2003 Nakazato et al. ............ 257/544
2003/0198083 A1 * 10/2003 Akaogi et al. ........... 365/185.09
2006/0097380 A1 * 5/2006 Sato ........................... 257/706
2007/0085596 A1 * 4/2007 Ito ............................. 327/534
2007/0155052 A1 * 7/2007 Terasawa et al. ............ 438/108
2007/0176673 A1 * 8/2007 Ito ............................. 327/544

FOREIGN PATENT DOCUMENTS

| JP | 11-340472 | 12/1999 |
| JP | 2000-243973 | 9/2000 |
| JP | 2002-217420 | 8/2002 |
| JP | 2004-193146 | 7/2004 |

* cited by examiner

*Primary Examiner*—Fernando L Toledo
(74) *Attorney, Agent, or Firm*—Oblon, Spivak, McClelland, Maier & Neustadt, P.C.

(57) ABSTRACT

An FTI structure is employed in an isolation region making contact in a Y direction with a P-type impurity region serving as a drain region of a PMOS transistor. First, second and third N-type impurity layers serving as body regions are connected to a high potential line via fourth, fifth and sixth N-type impurity layers, respectively, and further via a seventh N-type impurity layer. The fourth to sixth N-type impurity layers are provided between an insulating layer of an SOI substrate and an element isolation insulating film in a PTI region.

9 Claims, 25 Drawing Sheets

F I G. 6
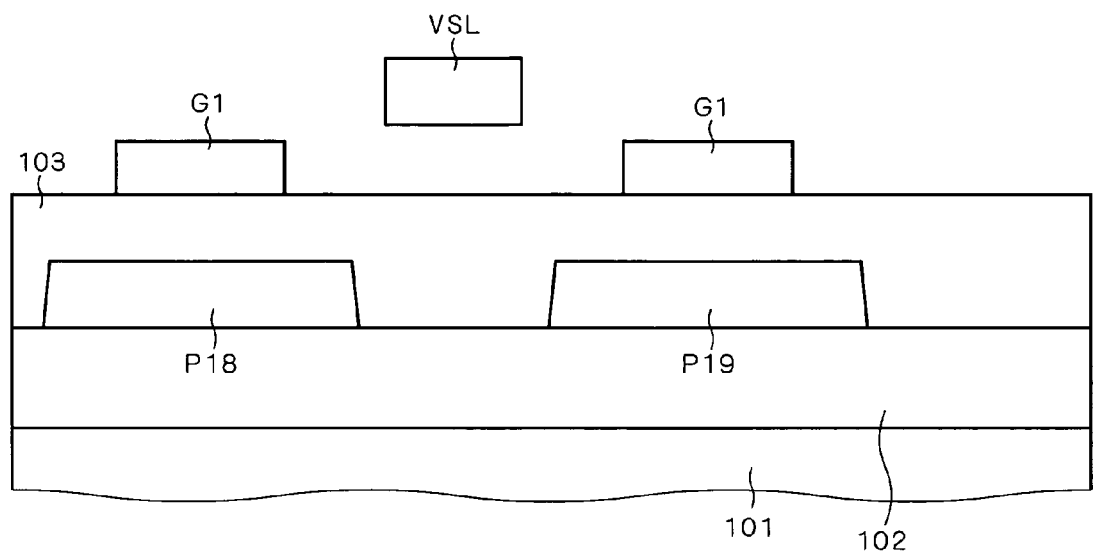
F I G. 7
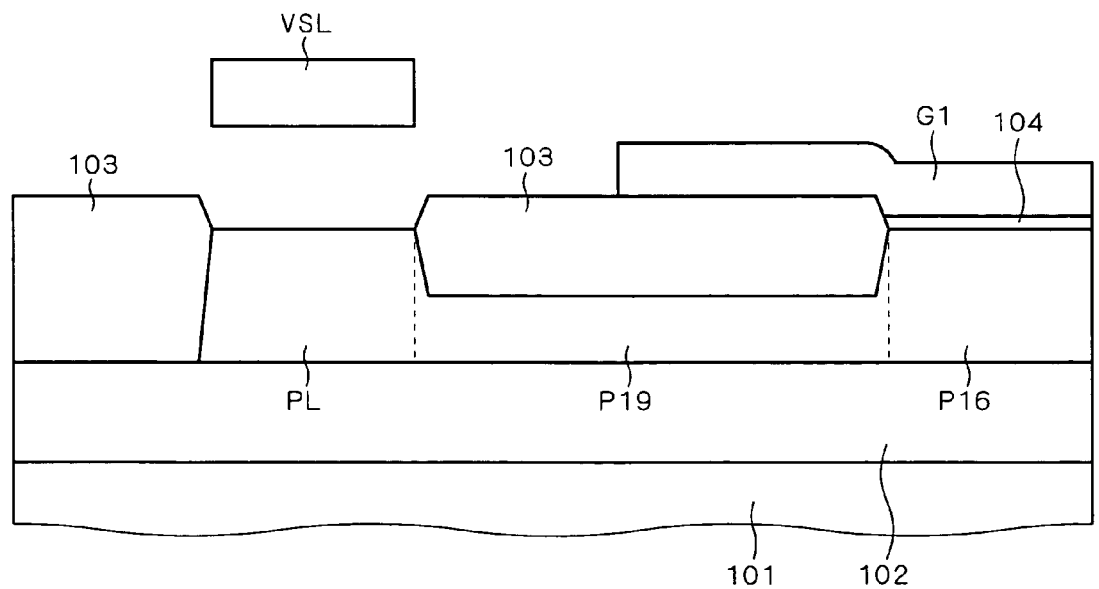

F I G . 2 7
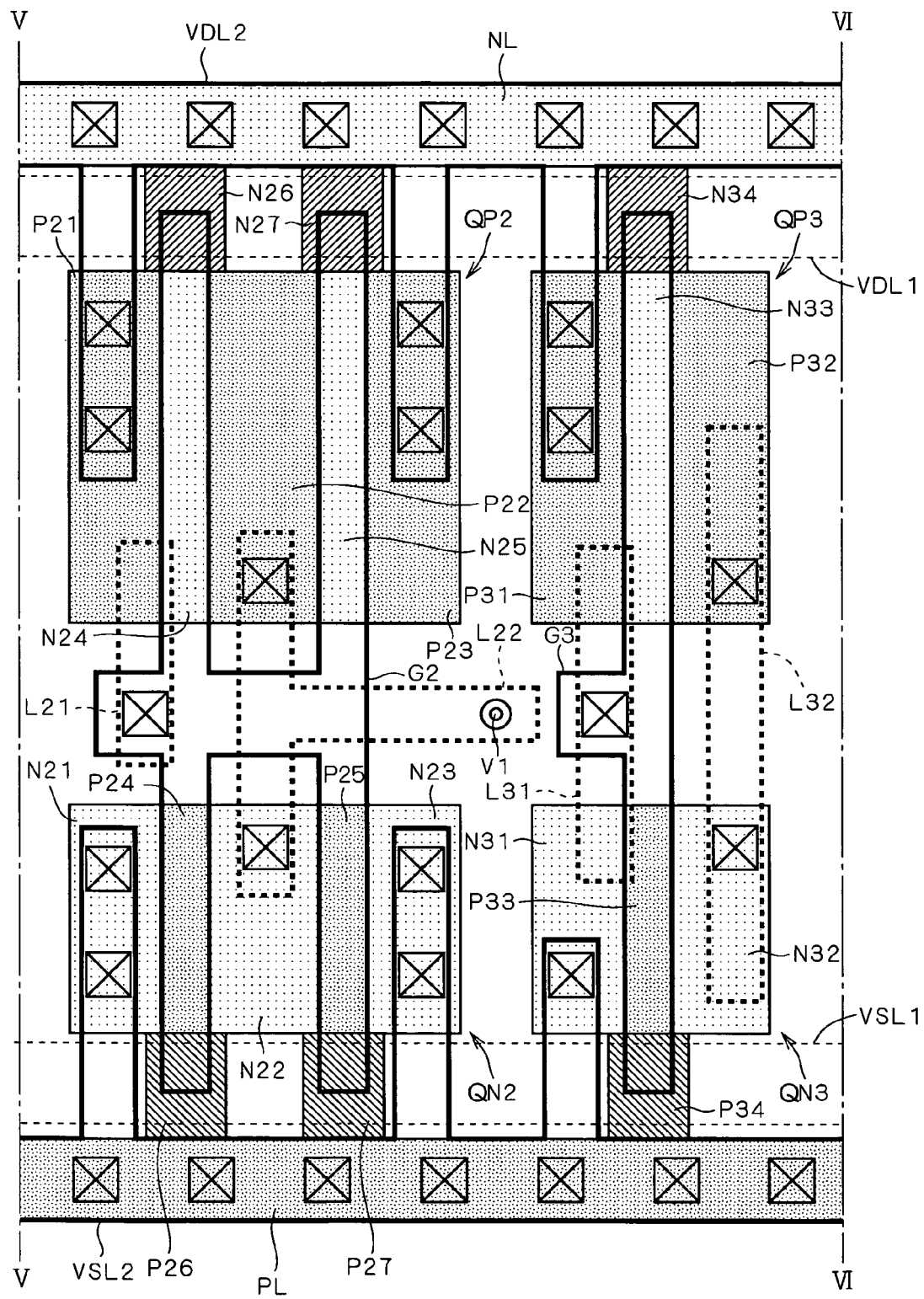

SEMICONDUCTOR DEVICE, METHOD OF MANUFACTURE THEREOF AND SEMICONDUCTOR INTEGRATED CIRCUIT

BACKGROUND OF THE INVENTION

1. Field of the Invention

The present invention relates to element isolation techniques, and especially to element isolation regarding MIS (Metal Insulator Semiconductor) transistors formed on an SOI (Silicon On Insulator) substrate.

2. Description of the Background Art

It is known that an insulating film is used in an element isolation technique for isolating a plurality of MIS transistors (MOS transistors, for example). The insulating film for element isolation is formed by a process from the surface of a semiconductor substrate on which the MOS transistors are to be formed.

In the so-called bulk type MOS transistor, namely a MOS transistor including a source region and a drain region by forming high concentration impurity layers restrictively in the surface of a semiconductor substrate, a region left between the source and drain regions in the semiconductor substrate is connected to the surface of the semiconductor substrate as well. This allows the potential of the so-called back gate (semiconductor layer capable of forming a channel in a position facing a gate) to be controlled easily from the surface side of the semiconductor substrate.

However, a semiconductor layer in an SOI substrate is typically thin so that the source region, drain region and the insulating film for element isolation are formed reaching the so-called buried insulating layer. A technique of separating the insulating film for element isolation from the buried insulating layer has therefore been proposed in order to easily fix the potential of the so-called body region that is interposed between the source and drain regions and faces a gate electrode on the opposite side to the buried insulating layer. For example, the potential of the body region is controlled via an impurity region provided between the insulating film for element isolation and the buried insulating layer. Such technique is introduced in, for example, Japanese Patent Application Laid-Open Nos. 11-340472 (1999), 2004-193146, 2002-217420 and 2000-243973, and a publication entitled "Bulk-Layout-Compatible 0.18-µm SOI-MOS Technology Using Body-Tied Partial-Trench-Isolation (PTI)", by Yuuichi Hirano, et al., IEEE TRANSACTIONS ON ELECTRON DEVICES, VOL. 48, NO. 12, DECEMBER 2001.

The simple separation of the insulating film for element isolation from the buried insulating layer, however, will result in a pn junction being formed and resultant capacitance being generated between the source and drain regions and the impurity layer left between the insulating film for element isolation and the buried insulating layer. This causes an increase in parasitic capacitance of the source and drain regions.

In addition, a gate electrode and wiring connected to the source and drain regions are installed on the insulating film for element isolation as well. That causes the impurity layer left between the insulating film for element isolation and the buried insulating layer to contribute to an increase in parasitic capacitance of the wiring.

SUMMARY OF THE INVENTION

It is an object of the present invention to provide a technique of reducing parasitic junction capacitance of a source region and a drain region, and reducing parasitic capacitance of wiring.

According to a first aspect of the present invention, a semiconductor device includes a plurality of MIS transistors and an element isolation insulating film. The MIS transistors are formed in a semiconductor layer provided on an insulating layer, and each of the MIS transistors includes at least one gate electrode, a source region, a drain region and a body region, the source, drain and body regions reaching the insulating layer. The element isolation insulating film isolates the MIS transistors from one another. The body region is interposed between the source region and the drain region, and faces the gate electrode on the opposite side to the insulating layer. The element isolation insulating film between the source region and the drain region between different transistors reaches the insulating layer in a second direction, the second direction being perpendicular both to a thickness direction of the semiconductor layer and to a first direction in which the gate electrode extends in the MIS transistor.

The nonexistence of an impurity layer on the second direction side of the source and drain regions allows a reduction in parasitic junction capacitance of these regions. In addition, parasitic capacitance of wiring installed on the opposite side to the insulating layer is reduced between a source region of one transistor and a drain region of another transistor adjacent in the second direction to the one transistor.

According to a second aspect of the present invention, a semiconductor integrated circuit includes a Type I block, a Type II block and an isolation region, and is formed in the semiconductor layer provided on the insulating layer. The Type I block forms a circuit that includes the semiconductor device according to the first aspect. The Type II block forms another circuit. The isolation region isolates the blocks. An isolation insulating film isolating blocks reaches the insulating layer at least in a position where interblock wiring for interconnecting the blocks is installed.

Even when wiring for interconnecting the blocks is provided, the isolation of the Type I block and the Type II block from one another by the FTI region only results in small parasitic capacitance of the interblock wiring.

According to a third aspect of the present invention, a method of manufacturing a semiconductor device includes the following steps (a) to (g). In step (a), a semiconductor substrate including an insulating layer and a semiconductor layer provided on the insulating layer is prepared. In step (b), a silicon nitride film is formed above the semiconductor layer. In step (c), the silicon nitride film is patterned by a photolithography technique. In step (d), the semiconductor layer is etched to a depth that does not reach the insulating layer, with the silicon nitride film having been patterned as a mask. In step (e), a photoresist is formed above the silicon nitride film having been patterned and the semiconductor layer having been etched, to pattern the photoresist. In step (f), part of the semiconductor layer having been etched is further etched to a depth that reaches the insulating layer, with the photoresist and the silicon nitride film having been patterned as a mask. In step (g), an insulating film is buried both in a portion of the semiconductor layer having been etched to a depth that does not reach the insulating layer and in a portion of the semiconductor layer having been etched to a depth that reaches the insulating layer, to form an element isolation insulating film.

The semiconductor layer is etched to a depth that does not reach the insulating layer with the silicon nitride film as a mask, and then part of the etched semiconductor layer is further etched to a depth that reaches the insulating layer, with the photoresist and the silicon nitride film as a mask. Thereafter, the insulating film is buried in the etched portions to form the element isolation insulating film. As a result, an element isolation insulating film that does not reach the insulating layer and an element isolation insulating film that reaches the insulating layer can be formed. In addition, since both of the photoresist and the silicon nitride film are used as a mask during the etching to a depth that reaches the insulating layer, the element isolation insulating film that reaches the insulating layer will not be expanded accidentally even when patterning misalignment of the photoresist occurs.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a cross-sectional view taken along positions 6-6' in FIG. 1;

FIG. 7 is a cross-sectional view taken along positions 7-7' in FIG. 1;

FIG. 27 is a plan view illustrating, together with FIGS. 26 and 28, the element isolation technique according to the fifth preferred embodiment;

DESCRIPTION OF THE PREFERRED EMBODIMENTS

First Preferred Embodiment

Figure 1:
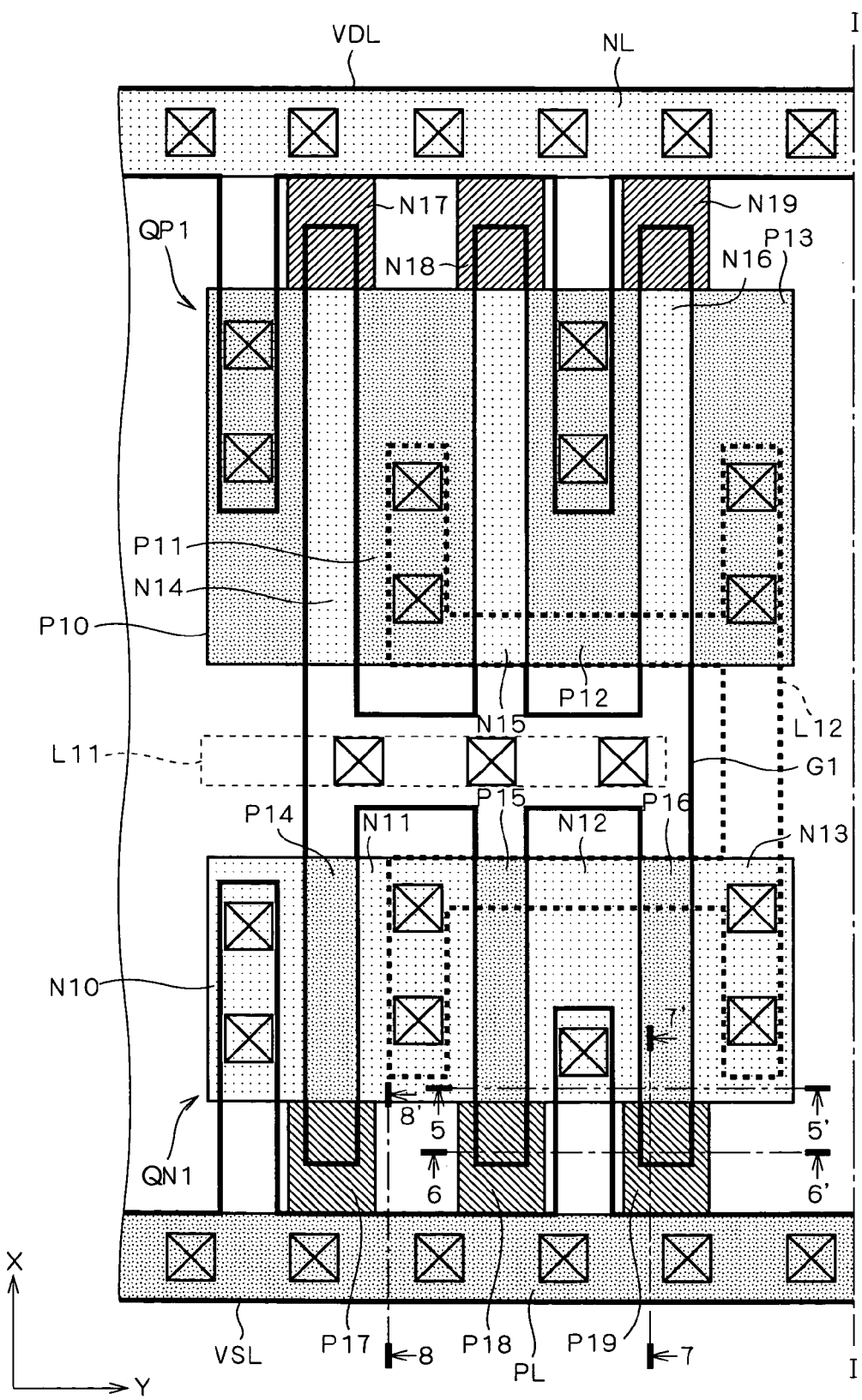
FIG. 1 is a plan view illustrating, together with FIGS. 2 and 3, an element isolation technique according to a first preferred embodiment of the present invention.
Figure 2:
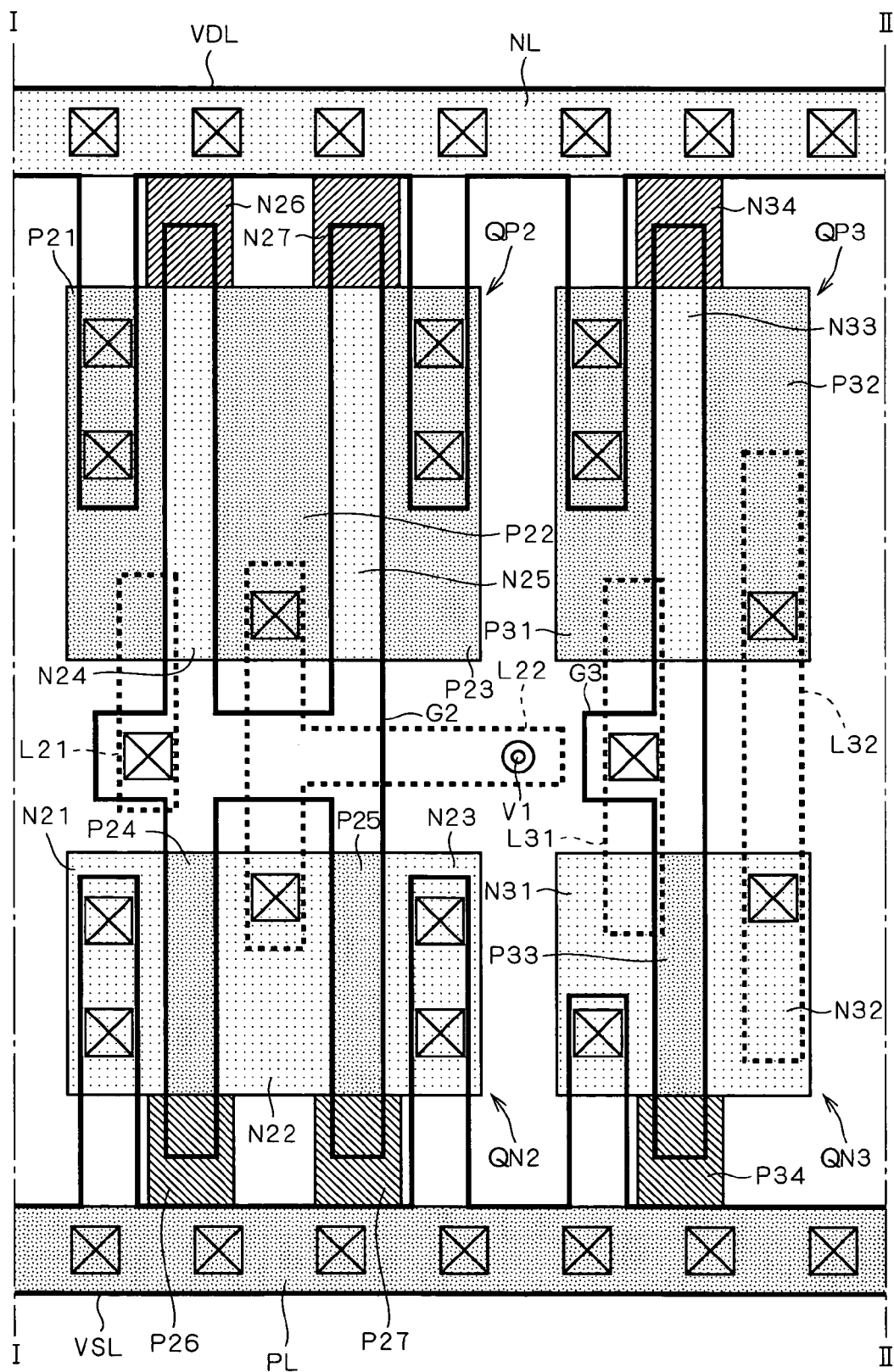
FIG. 2 is a plan view illustrating, together with FIGS. 1 and 3, the element isolation technique according to the first preferred embodiment.
Figure 3:
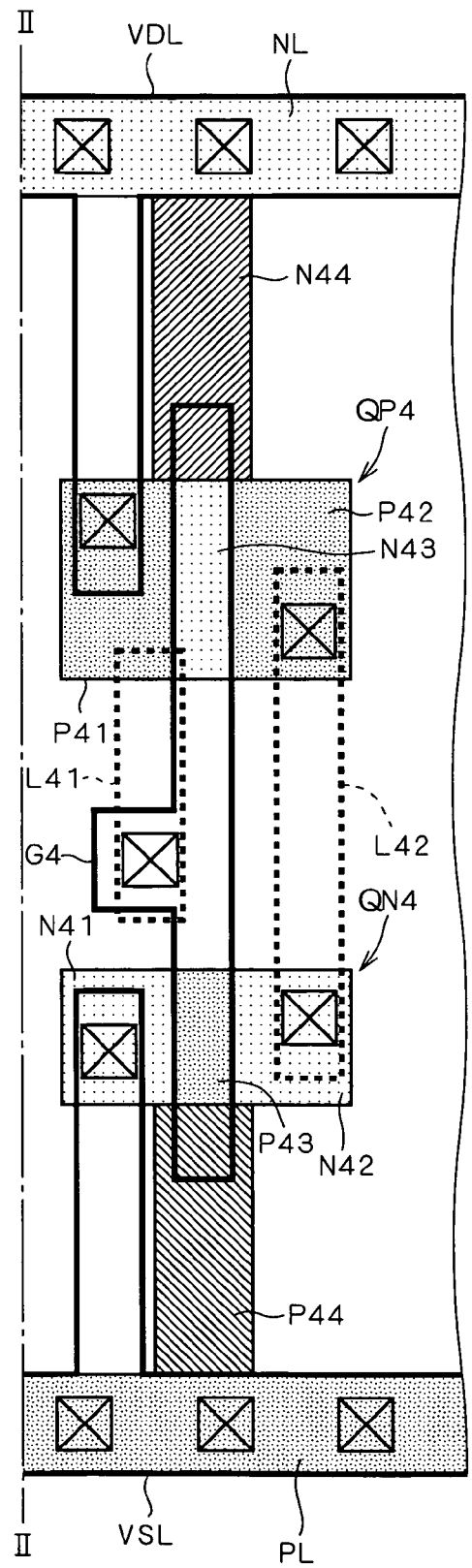
FIG. 3 is a plan view illustrating, together with FIGS. 1 and 2, the element isolation technique according to the first preferred embodiment.
Figure 4:
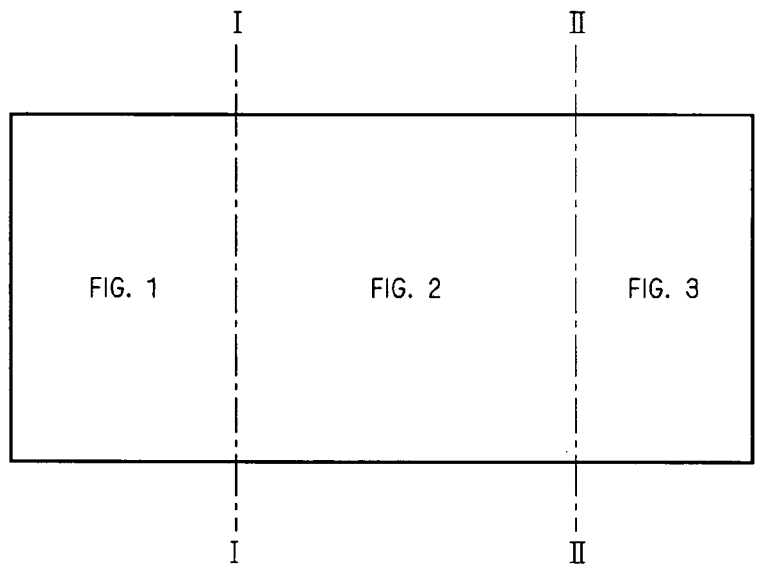
FIG. 4 is a schematic view depicting connections of FIGS. 1 to 3.

FIGS. 1 to 3 are plan views together illustrating an element isolation technique according to a first preferred embodiment of the present invention. FIG. 4 is a schematic view depicting connections of FIGS. 1 to 3. FIGS. 1 and 2 are connected along an imaginary line I-I, and FIGS. 2 and 3 along an imaginary line II-II, to form the whole of the plan views.

In FIGS. 1 to 3, a gate array is illustrated in which a low potential line VSL, a group of NMOS transistors, a group of PMOS transistors, and a high potential line VDL are arranged in this order with respect to a direction (positive direction of an X direction) from the lower part to the upper part in the drawings. The low potential line, the high potential line, the group of NMOS transistors and the group of PMOS transistors are all formed in an SOI substrate (not shown). The application to a gate array should not be construed as limiting the present invention.

Each of the low potential line VSL and the high potential line VDL includes a main line extending along a direction (positive direction of a Y direction) from left to right in the drawings, and a branch line extending along the X direction. A P-type impurity layer PL and an N-type impurity layer NL are formed in positions where the main line of the low potential line VSL is provided and the main line of the high potential line VDL is provided, respectively, in the SOI substrate. The main line of the low potential line VSL is connected to the P-type impurity layer PL, and the main line of the high potential line VDL to the N-type impurity layer NL, respectively, via contact holes (marked with an X enclosed with a square in the drawings).

The X direction indicates a direction in which gate electrodes extend in the NMOS transistors and the PMOS transistors, and the Y direction indicates a direction perpendicular to the X direction. Both the X and Y directions are perpendicular to a thickness direction of an insulating layer in the SOI substrate.

In the upper part of FIG. 1, P-type impurity layers P10, P11, P12 and P13 are arranged in this order along the positive direction of the Y direction. And with respect to the Y direction, N-type impurity layers N14, N15 and N16 are interposed between the P-type impurity layers P10, P11, P12 and P13, to extend in the X direction. Likewise, in the lower part of FIG. 1, N-type impurity layers N10, N11, N12 and N13 are arranged in this order along the positive direction of the Y direction. And with respect to the Y direction, P-type impurity layers P14, P15 and P16 are interposed between the N-type impurity layers N10, N11, N12 and N13, to extend in the X direction. The P-type impurity layers P10 to P16 and the N-type impurity layers N10 to N16 are formed through an SOI layer (not shown) in a thickness direction. The positions of these layers illustrated in FIG. 1 are exposed at the SOI layer.

A gate electrode G1 includes portions facing the N-type impurity layers N14, N15, N16 and the P-type impurity layers P14, P15, P16 and extending in the X direction, and a portion connected to these portions and extending in the Y direction. The portion extending in the Y direction of the gate electrode G1 is connected to wiring L11 via contact holes, the wiring L11 being further away from the SOI substrate than the gate electrode G1 is.

The P-type impurity layers P10 and P12 are connected to the branch line of the high potential line VDL, and the N-type impurity layers N10 and N12 to the branch line of the low potential line VSL, respectively, via contact holes. The P-type impurity layers P11, P13 and the N-type impurity layers N11, N13 are connected to wiring L12 via contact holes, the wiring L12 being further away from the SOI substrate than the gate electrode G1 is.

In such ways, in the FIG. 1 structure, a PMOS transistor QP1 with the P-type impurity layers P10, P12 as a source region, the P-type impurity layers P11, P13 as a drain region and the N-type impurity layers N14, N15, N16 as a body region, and an NMOS transistor QN1 with the N-type impurity layers N10, N12 as a source region, the N-type impurity layers N11, N13 as a drain region and the P-type impurity layers P14, P15, P16 as a body region are connected in series via the wiring L12 between the low potential line VSL and the high potential line VDL. The PMOS transistor QP1 and the NMOS transistor QN1 share the gate electrode G1.

In the upper part of FIG. 2, P-type impurity layers P21, P22 and P23 are arranged in this order along the positive direction of the Y direction. And with respect to the Y direction, N-type impurity layers N24 and N25 are interposed between the P-type impurity layers P21, P22 and P23, to extend in the X direction. Likewise, in the lower part of FIG. 2, N-type impurity layers N21, N22 and N23 are arranged in this order along the positive direction of the Y direction. And with respect to the Y direction, P-type impurity layers P24 and P25 are interposed between the N-type impurity layers N21, N22 and N23, to extend in the X direction. The P-type impurity layers P21 to P25 and the N-type impurity layers N21 to N25 are formed through the SOI layer in the thickness direction. The positions of these layers illustrated in FIG. 2 are exposed at the SOI layer.

A gate electrode G2 includes portions facing the N-type impurity layers N24, N25 and the P-type impurity layers P24, P25 and extending in the X direction, and a portion connected to these portions and extending in the Y direction. The portion extending in the Y direction of the gate electrode G2 is connected to wiring L21 via a contact hole, the wiring L21 being further away from the SOI substrate than the gate electrode G2 is.

The P-type impurity layers P21 and P23 are connected to the branch line of the high potential line VDL, and the N-type impurity layers N21 and N23 to the branch line of the low potential line VSL, respectively, via contact holes. The P-type impurity layer P22 and the N-type impurity layer N22 are connected to wiring L22 via contact holes, the wiring L22 being further away from the SOI substrate than the gate electrode G2 is. A via hole V1 for interconnecting the wiring L22 and wiring (not shown) to be further connected is formed in a position marked with a double circle in FIG. 2.

In such ways, in the FIG. 2 structure, a PMOS transistor QP2 with the P-type impurity layers P21, P23 as a source region, the P-type impurity layer P22 as a drain region and the N-type impurity layers N24, N25 as a body region, and an NMOS transistor QN2 with the N-type impurity layers N21, N23 as a source region, the N-type impurity layer N22 as a drain region and the P-type impurity layers P24, P25 as a body region are connected in series via the wiring L22 between the low potential line VSL and high potential line VDL. The PMOS transistor QP2 and the NMOS transistor QN2 share the gate electrode G2.

In addition, in the upper part of FIG. 2, P-type impurity layers P31 and P32 are arranged in this order along the positive direction of the Y direction. And with respect to the Y direction, an N-type impurity layer N33 is interposed between the P-type impurity layers P31 and P32, to extend in the X direction. Likewise, in the lower part of FIG. 2, N-type impurity layers N31 and N32 are arranged in this order along the positive direction of the Y direction. And with respect to the Y direction, a P-type impurity layer P33 is interposed between the N-type impurity layers N31 and N32, to extend in the X direction. The P-type impurity layers P31 to P33 and the N-type impurity layers N31 to N33 are formed through the SOI layer in the thickness direction. The positions of these layers illustrated in FIG. 2 are exposed at the SOI layer.

A gate electrode G3 includes a portion facing the N-type impurity layer N33 and the P-type impurity layer P33 and extending in the X direction, and a portion connected to this portion and extending in the Y direction. The portion extending in the Y direction of the gate electrode G3 is connected to wiring L31 via a contact hole, the wiring L31 being further away from the SOI substrate than the gate electrode G3 is.

The P-type impurity layer P31 is connected to the branch line of the high potential line VDL, and the N-type impurity layer N31 to the branch line of the low potential line VSL, respectively, via contact holes. The P-type impurity layer P32 and the N-type impurity layer N32 are connected to wiring L32 via contact holes, the wiring L32 being further away from the SOI substrate than the gate electrode G3 is.

In such ways, in the FIG. 2 structure, a PMOS transistor QP3 with the P-type impurity layer P31 as a source region, the P-type impurity layer P32 as a drain region and the N-type impurity layer N33 as a body region, and an NMOS transistor QN3 with the N-type impurity layer N31 as a source region, the N-type impurity layer N32 as a drain region and the P-type impurity layer P33 as a body region are further connected in series via the wiring L32 between the low potential line VSL and the high potential line VDL. The PMOS transistor QP3 and the NMOS transistor QN3 share the gate electrode G3.

In the upper part of FIG. 3, P-type impurity layers P41 and P42 are arranged in this order along the positive direction of the Y direction. And with respect to the Y direction, an N-type impurity layer N43 is interposed between the P-type impurity layers P41 and P42, to extend in the X direction. Likewise, in the lower part of FIG. 3, N-type impurity layers N41 and N42 are arranged in this order along the positive direction of the Y direction. And with respect to the Y direction, a P-type impurity layer P43 is interposed between the N-type impurity layers N41 and N42, to extend in the X direction. The P-type impurity layers P41 to P43 and the N-type impurity layers N41 to N43 are formed through the SOI layer in the thickness direction. The positions of these layers illustrated in FIG. 3 are exposed at the SOI layer.

A gate electrode G4 includes a portion facing the N-type impurity layer N43 and the P-type impurity layer P43 and extending in the X direction, and a portion connected to this portion and extending in the Y direction. The portion extending in the Y direction of the gate electrode G4 is connected to wiring L41 via a contact hole, the wiring L41 being further away from the SOI substrate than the gate electrode G4 is.

The P-type impurity layer P41 is connected to the branch line of the high potential line VDL, and the N-type impurity layer N41 to the branch line of the low potential line VSL, respectively, via contact holes. The P-type impurity layer P42 and the N-type impurity layer N42 are connected to wiring L42 via contact holes, the wiring L42 being further away from the SOI substrate than the gate electrode G4 is.

In such ways, in the FIG. 3 structure, a PMOS transistor QP4 with the P-type impurity layer P41 as a source region, the P-type impurity layer P42 as a drain region and the N-type impurity layer N43 as a body region, and an NMOS transistor QN4 with the N-type impurity layer N41 as a source region, the N-type impurity layer N42 as a drain region and the P-type impurity layer P43 as a body region are connected in series via the wiring L42 between the low potential line VSL and the high potential line VDL. The PMOS transistor QP4 and the NMOS transistor QN4 share the gate electrode G4.

In the structures described above, the N-type impurity layers and the P-type impurity layers are formed reaching the insulating layer serving as a base of the SOI layer. The impurity layers serving as body regions have channels formed on the opposite side to the insulating layer in the SOI substrate, upon application of a predetermined voltage to the gate electrodes facing the impurity layers.

A PTI (Partial Trench Isolation) structure is employed only in portions with oblique lines. An FTI (Full Trench Isolation) structure is employed in the other portions where no P-type impurity layers or N-type impurity layers are formed, namely portions without oblique lines or dots. The PTI structure is an element isolation structure in which an insulating film is provided only in the upper surface (gate electrodes G1 to G4 and wirings L11 to L42 side) of an SOI layer, thus leaving the SOI layer. The FTI structure is an element isolation structure in which an insulating film is provided from an insulating layer serving as a base of an SOI layer to the opposite side thereof, thus leaving no SOI layer. A region employing the PTI structure and a region employing the FTI structure may be hereafter referred to as a PTI region and an FTI region, respectively.

In FIG. 1, N-type impurity layers N17, N18, N19 and P-type impurity layers P17, P18, P19 are provided in PTI regions of the SOI layer. The N-type impurity layer N17 makes contact with the N-type impurity layers N14, NL and the P-type impurity layers P10, P11, the N-type impurity layer N18 with the N-type impurity layers N15, NL and the P-type impurity layers P11, P12, and the N-type impurity layer N19 with the N-type impurity layers N16, NL and the P-type impurity layers P12, P13, respectively. Accordingly, the N-type impurity layers N17, N18 and N19 have the function of connecting the body regions of the PMOS transistor QP1 to the high potential line VDL.

Likewise, in FIG. 1, the P-type impurity layer P17 makes contact with the P-type impurity layers P14, PL and the N-type impurity layers N10, N11, the P-type impurity layer P18 with the P-type impurity layers P15, PL and the N-type impurity layers N11, N12, and the P-type impurity layer P19 with the P-type impurity layers P16, PL and the N-type impurity layers N12, N13, respectively. Accordingly, the P-type impurity layers P17, P18 and P19 have the function of connecting the body regions of the NMOS transistor QN1 to the low potential line VSL.

Unlike conventional techniques, however, a PTI region is not provided widely around the PMOS transistor QP1 and the NMOS transistor QN1, but the elements are isolated by employing the FTI structure except the portions necessary for fixing body region potentials. Thus, the P-type impurity layers P10 to P13 and the N-type impurity layers N10 to N13 serving as source and drain regions form pn junctions in considerably limited portions with the impurity layers around them. That substantially avoids the problem in conventional techniques, namely the junction capacitance in an element isolation region. Further, parasitic capacitance can be reduced between the gate electrode G1, the wirings L11, L12 and the SOI layer.

In FIG. 2, N-type impurity layers N26, N27 and P-type impurity layers P26, P27 are provided in PTI regions of the SOI layer. The N-type impurity layer N26 makes contact with the N-type impurity layers N24, NL and the P-type impurity layers P21, P22, and the N-type impurity layer N27 with the N-type impurity layers N25, NL and the P-type impurity layers P22, P23, respectively. Accordingly, the N-type impurity layers N26 and N27 have the function of connecting the body regions of the PMOS transistor QP2 to the high potential line VDL.

Likewise, in FIG. 2, the P-type impurity layer P26 makes contact with the P-type impurity layers P24, PL and the N-type impurity layers N21, N22, and the P-type impurity layer P27 with the P-type impurity layers P25, PL and the N-type impurity layers N22, N23, respectively. Accordingly, the P-type impurity layers P26 and P27 have the function of connecting the body regions of the NMOS transistor QN2 to the low potential line VSL.

In addition, in FIG. 2, an N-type impurity layer N34 and a P-type impurity layer P34 are provided in PTI regions of the SOI layer. The N-type impurity layer N34 makes contact with the N-type impurity layers N33, NL and the P-type impurity layers P31, P32. Accordingly, the N-type impurity layer N34 has the function of connecting the body region of the PMOS transistor QP3 to the high potential line VDL.

Likewise, in FIG. 2, the P-type impurity layer P34 makes contact with the P-type impurity layers P33, PL and the N-type impurity layers N31, N32. Accordingly, the P-type impurity layer P34 has the function of connecting the body region of the NMOS transistor QN3 to the low potential line VSL.

Unlike conventional techniques, however, a PTI region is not provided widely around the PMOS transistors QP2, QP3 and the NMOS transistors QN2, QN3. Thus, the P-type impurity layers P21 to P23, P31, P32 and the N-type impurity layers N21 to N23, N31, N32 serving as source and drain regions form pn junctions in considerably limited portions with the impurity layers around them. That substantially avoids the problem in conventional techniques, namely the junction capacitance in an element isolation region. Further, parasitic capacitance can be reduced between the gate electrodes G2, G3, the wirings L21, L22, L31, L32 and the SOI layer.

Further, even when wiring (not shown) connected to the via hole V1 or an extension of the wiring L22 is installed extending in the X direction between the PMOS transistors QP2 and QP3 which are adjacently isolated with respect to the Y direction, the nonexistence of a semiconductor layer immediately below those wirings allows the parasitic capacitance to be reduced between those wirings and the SOI layer. Likewise, even when those wirings are installed extending in the X direction between the NMOS transistors QN2 and QN3 which are adjacently isolated with respect to the Y direction, the parasitic capacitance can be reduced between those wirings and the SOI layer.

In FIG. 3, an N-type impurity layer N44 and a P-type impurity layer P44 are provided in PTI regions of the SOI layer. The N-type impurity layer N44 makes contact with the N-type impurity layers N43, NL and the P-type impurity layers P41, P42. Accordingly, the N-type impurity layer N44 has the function of connecting the body region of the PMOS transistor QP4 to the high potential line VDL.

Likewise, in FIG. 3, the P-type impurity layer P44 makes contact with the P-type impurity layers P43, PL and the N-type impurity layers N41, N42. Accordingly, the P-type impurity layer P44 has the function of connecting the body region of the NMOS transistor QN4 to the low potential line VSL.

Unlike conventional techniques, however, a PTI region is not provided widely around the PMOS transistor QP4 and the NMOS transistor QN4. Thus, the P-type impurity layers P41, P42 and the N-type impurity layers N41, N42 serving as source and drain regions form pn junctions in considerably limited portions with the impurity layers around them. That substantially avoids the problem in conventional techniques, namely the junction capacitance in an element isolation region. Further, parasitic capacitance can be reduced between the gate electrode G4, the wirings L41, L42 and the SOI layer.

FIGS. 5, 6, 7 and 8 are cross-sectional views taken along positions 5-5', 6-6', 7-7' and 8-8' in FIG. 1, respectively, for the purpose of describing the PTI and FTI structures to higher degrees of detail. The left and right ends of FIG. 5 correspond to the positions 5 and 5' in FIG. 1, the left and right ends of FIG. 6 to the positions 6 and 6' in FIG. 1, the left and right ends of FIG. 7 to the positions 7 and 7' in FIG. 1, and the left and right ends of FIG. 8 to the positions 8 and 8' in FIG. 1, respectively.

In any of these drawings, an insulating layer 102 of the SOI substrate is provided on a substrate 101. By way of example, the substrate 101 is made of a semiconductor material, and the insulating layer 102 is a buried insulating film such as an oxide film. The total thickness of the insulating layer 102 and an SOI layer provided thereon is about 270 nm, for example. Interlayer insulating films and other wirings are omitted as appropriate in any of these drawings.

Figure 5:
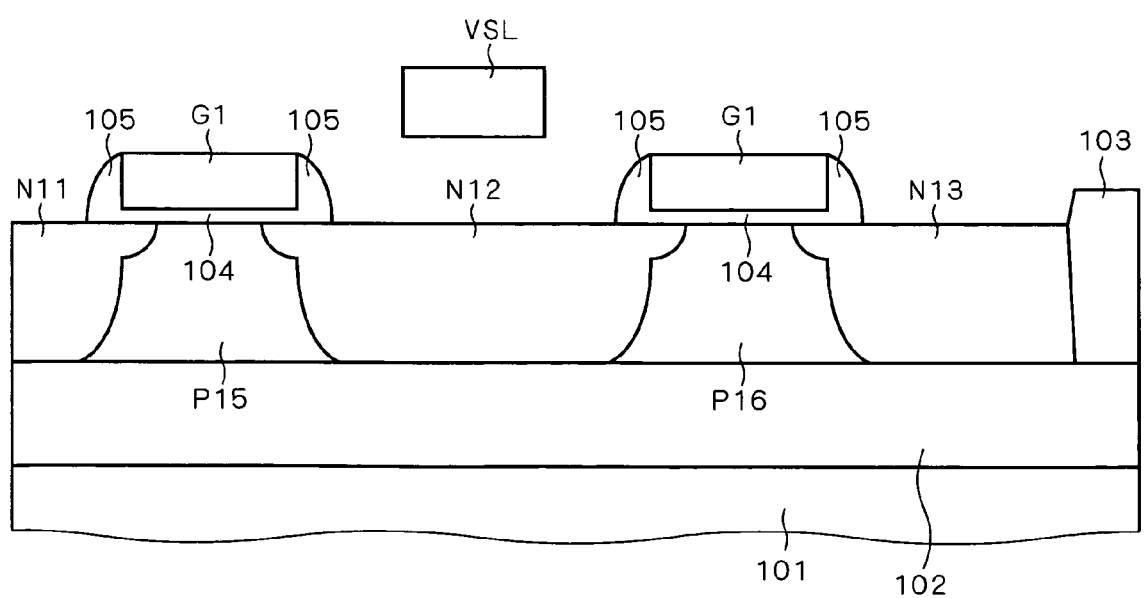
FIG. 5 is a cross-sectional view taken along positions 5-5' in FIG. 1.

Referring to FIG. 5, the gate electrode G1 faces the P-type impurity layers P15 and P16 via a gate insulating film 104, and has a sidewall 105 provided on the side surfaces thereof. The right end of FIG. 5 corresponds to the position 5', where the FTI structure is employed so that an element isolation insulating film 103 is provided through the SOI layer including the N-type impurity layers N11, N12, N13 and the P-type impurity layers P15, P16. The element isolation insulating film 103 reaches the insulating layer 102. The branch line of the low potential line VSL appears above the N-type impurity layer N12 (the branch line in practice is provided on the N-type impurity layer N12 via an interlayer insulating film).

As has been explained in connection with the wiring L22, even when wiring is installed in a portion employing the FTI structure, the capacitance between the wiring and the SOI layer can be reduced. This allows a signal delay resulting from the parasitic capacitance of the wiring to be minimized. In addition, the element isolation insulating film 103, to which the N-type impurity layer N13 serving as a drain region is adjacent, reaches the insulating layer 102, thus substantially avoiding the generation of junction capacitance in this portion.

Turning to FIG. 6, the gate electrode G1 and the branch line of the low potential line VSL are formed above the element isolation insulating film 103. The sidewalls are omitted, and the gate insulating films are included in the element isolation insulating film 103 in this drawing. The left and right ends of FIG. 6 correspond to the positions 6 and 6', respectively, where the FTI structure is employed. The FTI structure is also employed immediately below the branch line of the low potential line VSL. Meanwhile, the PTI structure is employed in positions where the P-type impurity layers P18 and P19 are provided so that the element isolation insulating film 103 is provided only in the upper part of the SOI layer. The P-type impurity layers P18 and P19 are left below the element isolation insulating film 103 (insulating layer 102 side).

The element isolation insulating film 103 in the PTI regions is deeper than, for example, extension parts (shallow impurity regions extending toward a lower place of the gate electrode of the impurity layers serving as source and drain regions) of the impurity layers serving as source and drain regions, and is about 90 nm in thickness, for example.

With respect to FIG. 6, the P-type impurity layer PL makes contact with the P-type impurity layers P18 and P19 from the front in the drawing, while the P-type impurity layers P15 and P16 make contact with the P-type impurity layers P18 and P19 from the back, respectively, with the P-type impurity layer PL being connected to the low potential line VSL via the contact holes. As illustrated in FIG. 7, formed below the element isolation insulating film 103 in the PTI region is the P-type impurity layer P19, through which the P-type impurity layer PL is connected to the P-type impurity layer P16.

Figure 8:
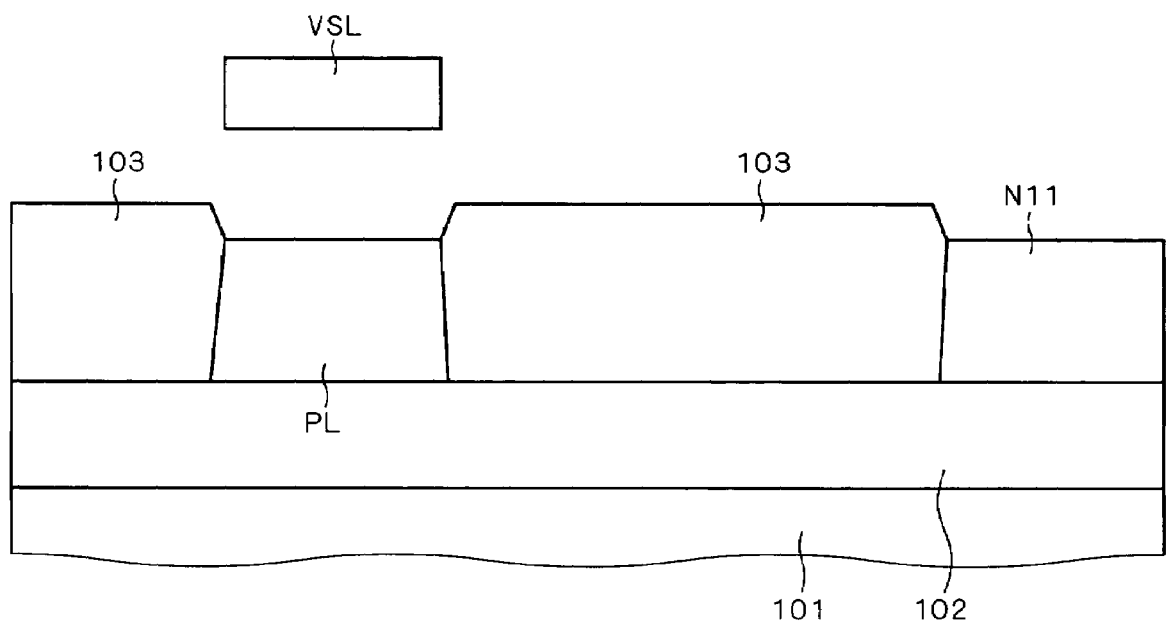
FIG. 8 is a cross-sectional view taken along positions 8-8' in FIG. 1.

Accordingly, the P-type impurity layers P15 and P16 serving as body regions of the NMOS transistor QN1 are fixed in potential by the low potential line VSL. Although not shown, the P-type impurity layer P14 serving as a body region of the NMOS transistor QN1 is also connected to the low potential line VSL via the P-type impurity layer PL and the P-type impurity layer P17 in the PTI region, to be fixed in potential. Because the PTI regions around the N-type impurity layers N10 to N13 are limited to the portions necessary for fixing the body region potentials, the FTI structure is employed immediately below the branch line of the low potential line VSL. The N-type impurity layer N11 does not form pn junctions with the other impurity layers in the positions employing the FTI structure, as illustrated in FIG. 8, for example, which allows a reduction in junction capacitance.

As such, it is desirable that PTI regions be limited near body regions. More specifically, the width of a PTI region with respect to the Y direction should be set to the same as that between the ends of a sidewall of a gate electrode, for example. With extension parts typically being formed below a sidewall, the setting of a PTI region width in such a manner allows impurity regions in the PTI region to make contact with the body region with reliability.

To put it more specifically, the sidewall 105 is formed on both side surfaces along the X direction of the gate electrode G1 in FIG. 5. The N-type impurity region N12 serving as a source region and the N-type impurity region N11 serving as a drain region have an extension part in a position facing the sidewalls 105. The width along the Y direction of the element isolation insulating film 103 near the P-type impurity region P15 serving as a body region is set from the end of one sidewall 105 to reach the end of the other sidewall 105 along the Y direction via the gate electrode G1.

Alternatively, in order to reduce the resistance of the impurity regions provided in the PTI region to fix the body region potentials while at the same time reducing the parasitic capacitance of the gate electrode extending above the PTI region, it is desirable that the width with respect to the Y direction of the PTI region in contact with the body region be extended by a predetermined width from the ends of the body region to the source and drain regions. Since the parasitic capacitance can be reduced as the predetermined width becomes smaller, this predetermined width should be set to a minimum permissible width in a design rule.

Second Preferred Embodiment

As illustrated in FIG. 3, the gate width of the transistors QP4 and QN4 is narrower than the gate widths of the transistors QP1 to QP3 and QN1 to QN3. In order to reduce the resistance of the gate electrode G4 that is used both in the transistors QP4 and QN4, it is desirable that the transistors QP4 and QN4 be arranged close to each other with respect to the X direction.

Such arrangement, however, causes the N-type impurity layer N44 and the P-type impurity layer P44 in the PTI regions to increase in length in the X direction. A current flows in the X direction through the N-type impurity layer N44 that is interposed between and adjacently to the N-type impurity layers NL and N43. The same thing occurs in the P-type impurity layer P44. It is therefore desirable from the viewpoint of reducing the resistance of the impurity regions for fixing the body region potentials that the width with respect to the Y direction of the PTI regions be increased.

However, the simple width increase with respect to the Y direction of the PTI regions will result in an increase in junction capacitance. More specifically, a simple width increase in the Y direction of the N-type impurity layer N44 while maintaining it as a rectangle in FIG. 3, for example, will result in an unnecessary increase in junction capacitance that is generated between the N-type impurity layer N44 and the P-type impurity regions P41, P42, and will further result in the generation of unnecessary parasitic capacitance with the branch line of the high potential line VDL.

With this being the situation, the width in the Y direction of the PTI regions should remain narrow in portions making contact with the source and drain regions, and be increased from a position away from the contacting portions. This allows a reduction in resistance of those impurity regions without increasing unnecessarily the junction capacitance. In addition, it is desirable that the PTI regions not be extended to a position where the branch line of the high potential line VDL is formed in order to avoid an increase in parasitic capacitance of the high potential line VDL.

Figure 9:
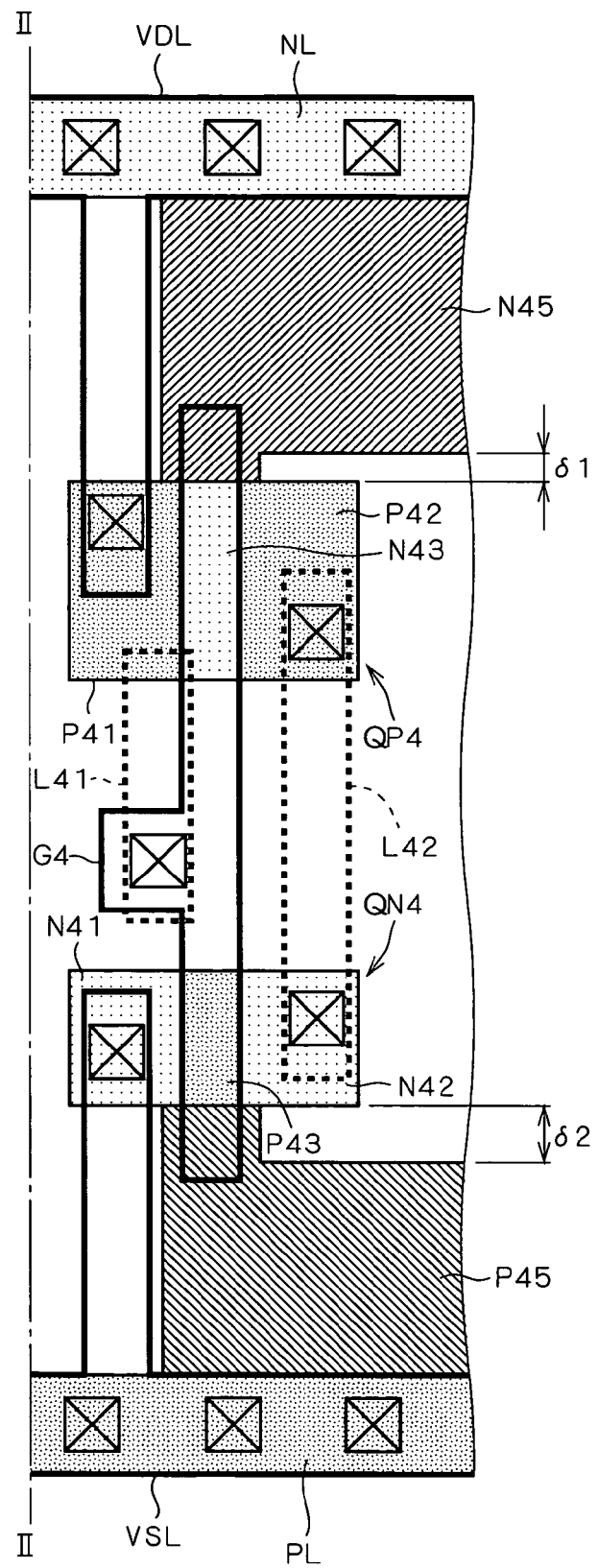
FIG. 9 is a plan view illustrating an element isolation technique according to a second preferred embodiment of the present invention.

FIG. 9 is a plan view illustrating the structure of an improved semiconductor device in view of the above. Like FIG. 3, FIG. 9 is connected along the imaginary line II-II. When compared to the FIG. 3 structure, the N-type impurity layer N44 and the P-type impurity layer P44 are replaced with an N-type impurity layer N45 and a P-type impurity layer P45, respectively. The PTI structure is employed in positions where the N-type impurity layer N45 and the P-type impurity layer P45 are provided so that an element isolation film (element isolation film 103 illustrated in FIGS. 5 to 8) is provided not reaching the insulating layer on the opposite side to an insulating layer (insulating layer 102 illustrated in FIGS. 5 to 8) of the SOI substrate. Stated another way, the N-type impurity layer N45 and the P-type impurity layer P45 are provided between the element isolation film and the insulating layer, to form PTI regions.

The width of the N-type impurity layer N45 on the side making contact with the PMOS transistor QP4 is set to the same as the N-type impurity layer N44 in FIG. 3. However, the width in the Y direction of the N-type impurity layer N45 is increased beyond a distance $\delta 1$ to the N-type impurity layer NL, the distance $\delta 1$ being from the end in the X direction of the N-type impurity region N43 and the P-type impurity regions P41, P42 on the side closer to the N-type impurity region NL.

This avoids an increase in junction capacitance formed between the P-type impurity regions P41, P42 and the other impurities, while reducing a resistance value in the X direction of the N-type impurity layer N45 lower than that of the N-type impurity region N44.

The width of the P-type impurity layer P45 on the side making contact with the NMOS transistor QN4 is set to the same as the P-type impurity layer P44 in FIG. 3. However, the width in the Y direction of the P-type impurity layer P45 is increased beyond a distance $\delta 2$ to the P-type impurity layer PL, the distance $\delta 2$ being from the end in the X direction of the P-type impurity region P43 and the N-type impurity regions N41, N42 on the side closer to the P-type impurity region PL.

This avoids an increase in junction capacitance formed between the N-type impurity regions N41, N42 and the other impurities, while reducing a resistance value in the X direction of the P-type impurity layer P45 lower than that of the P-type impurity region P44.

For the P-type impurity regions P41 and P42 not to make contact with the widened portion of the N-type impurity region N45, and for the N-type impurity regions N41 and N42 not to make contact with the widened portion of the P-type impurity region P45, it is required to set the distances $\delta 1$ and $\delta 2$ positive. Further, in order to reduce the resistance with respect to the X direction of the widened portion of the N-type impurity region N45 and the widened portion of the P-type impurity region P45, the distances distances $\delta 2$ and $\delta 2$ should be set small. It is therefore desirable that the distances $\delta 1$ and $\delta 2$ be set to minimum permissible widths in a design rule.

The widening of the N-type impurity region N45 and the P-type impurity region P45 involves, as a matter of course, an increase in parasitic capacitance of these regions. Assuming that the parasitic capacitance of the gate electrode G4 is Cg (which includes both the so-called gate capacitance due to the MIS structure and the parasitic capacitance generated between the N-type impurity region N45 and the P-type impurity region P45), the resistance of the gate electrode G4 is Rg, and the resistance and capacitance of the N-type impurity region N45 and the P-type impurity region P45 are Rpti and Cpti, respectively, the width of the PTI regions is set in such a manner that a time constant {Rpti(Cpti+Cg)+RgCg} satisfies a value defined by the operating frequency of a circuit, for example the time constant becomes smaller than the inverse of the operating frequency of the circuit.

Figure 10:
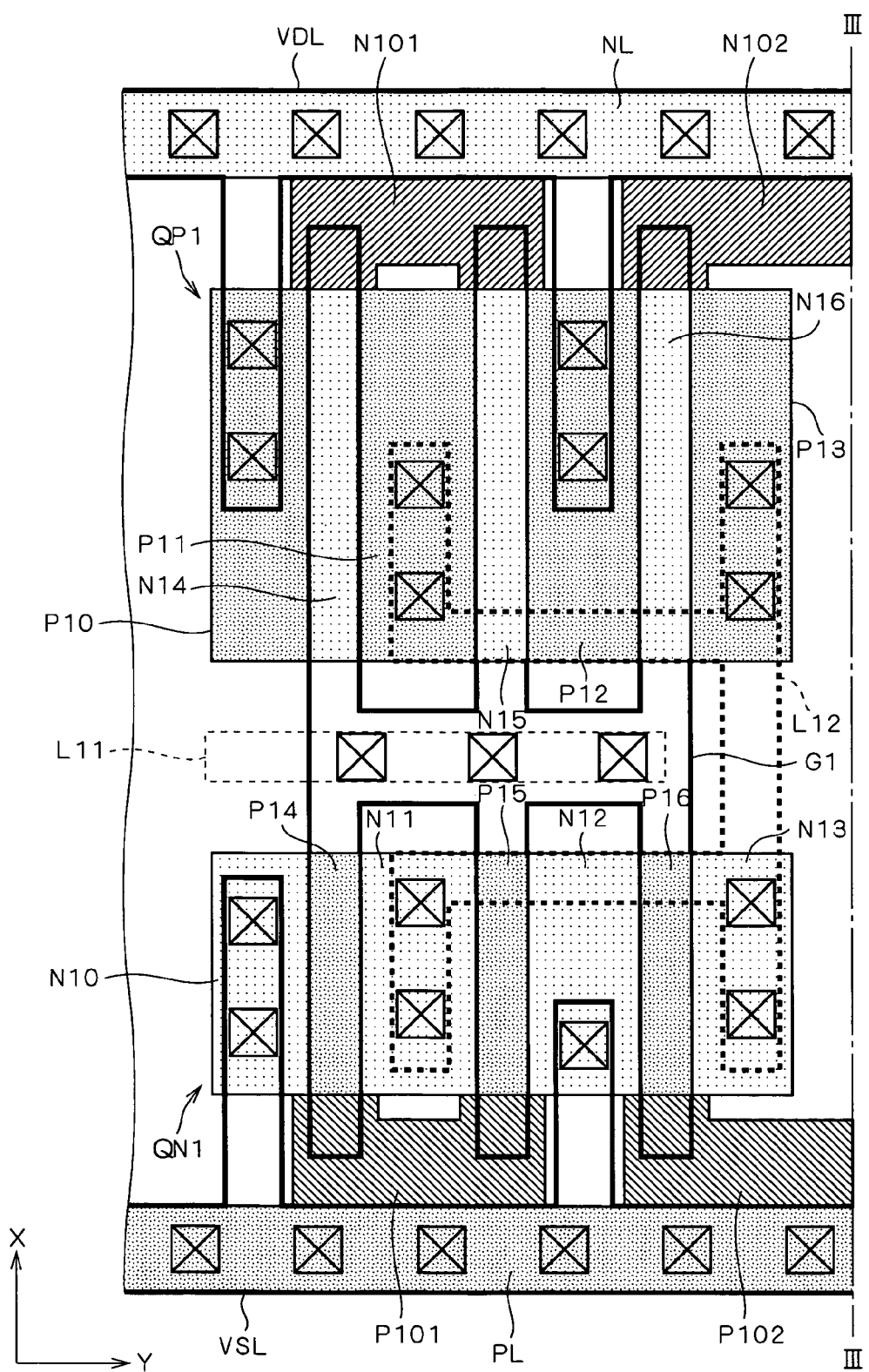
FIG. 10 is a plan view illustrating, together with FIGS. 11 and 12, the element isolation technique according to the second preferred embodiment.
Figure 11:
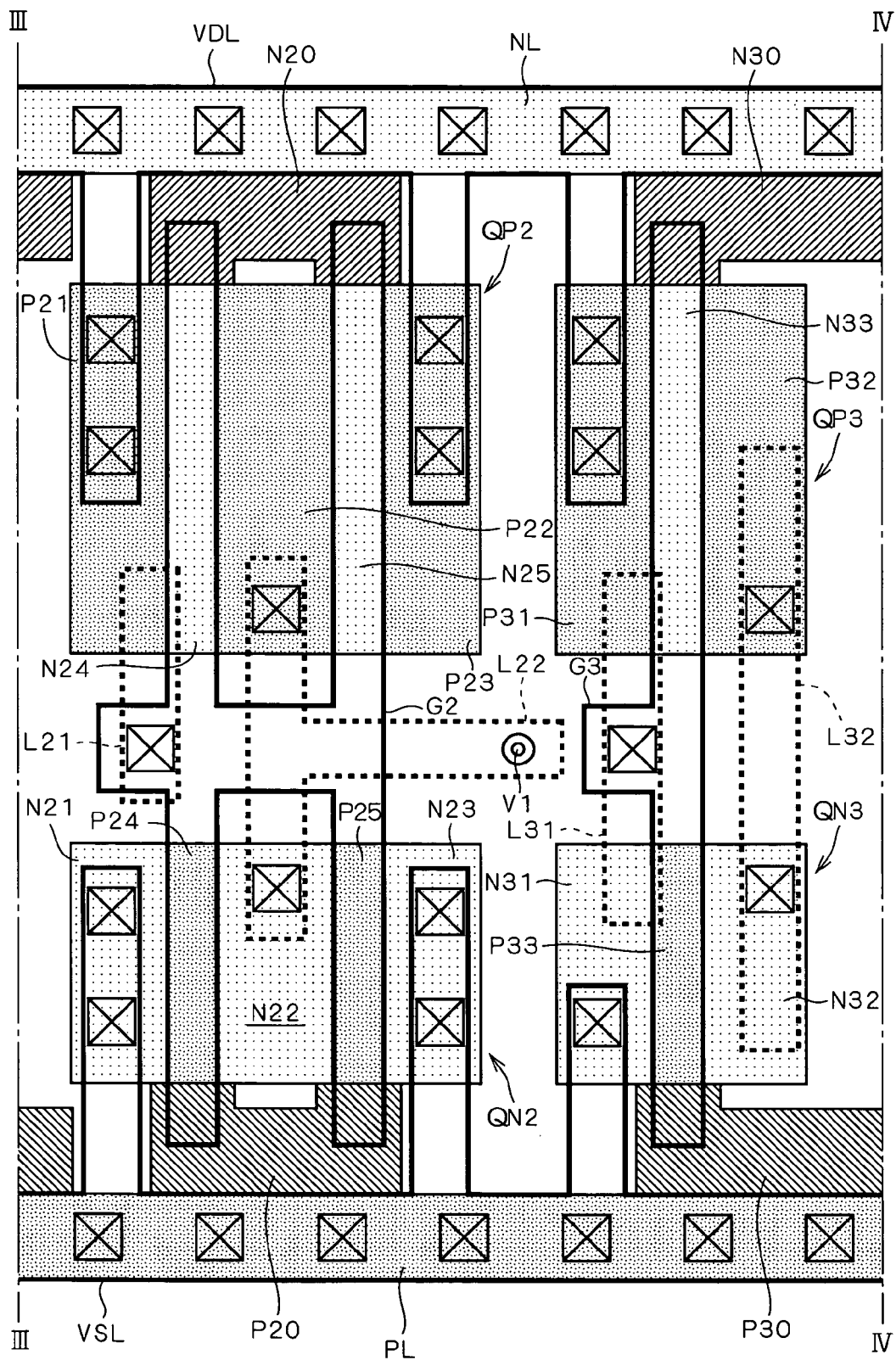
FIG. 11 is a plan view illustrating, together with FIGS. 10 and 12, the element isolation technique according to the second preferred embodiment.
Figure 12:
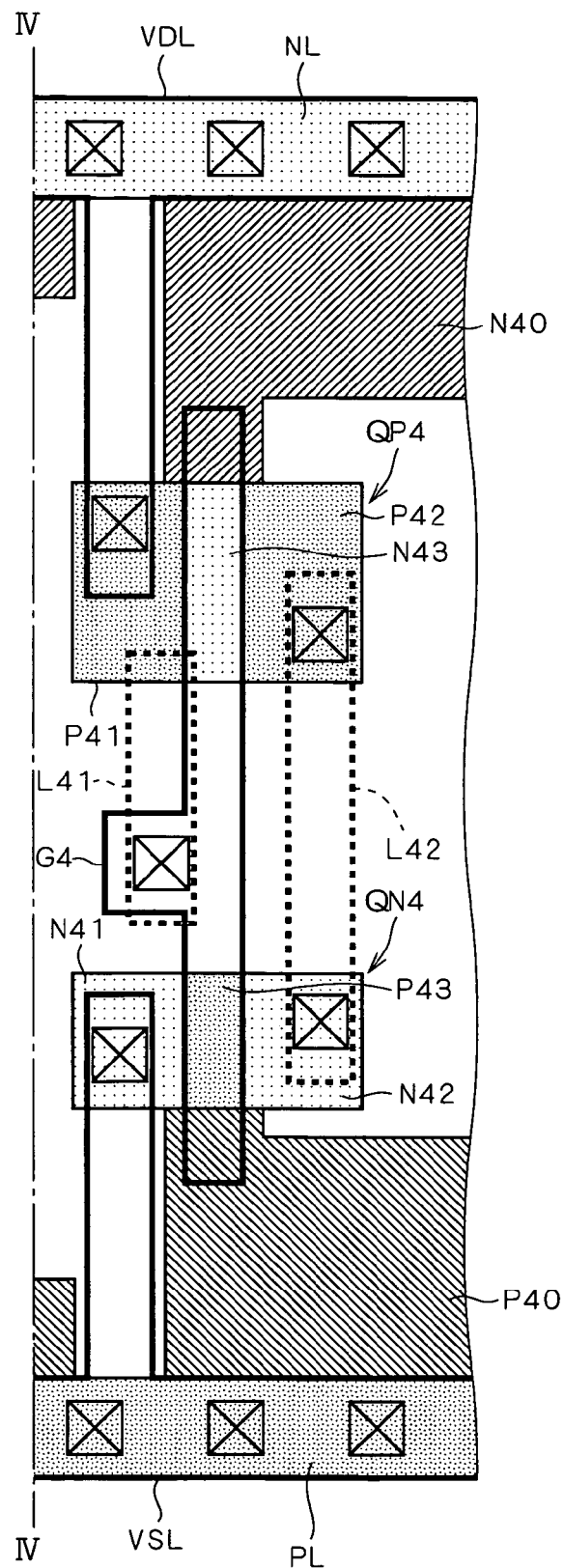
FIG. 12 is a plan view illustrating, together with FIGS. 10 and 11, the element isolation technique according to the second preferred embodiment.
Figure 13:
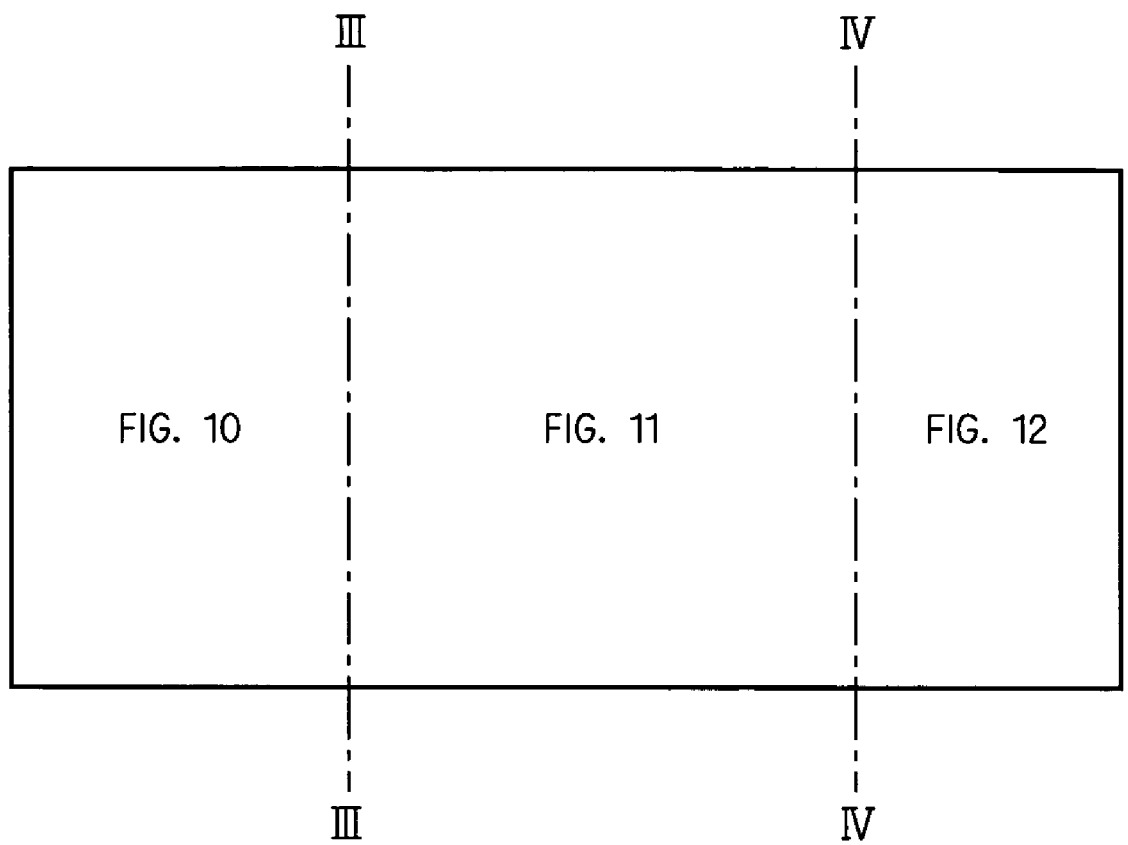
FIG. 13 is a schematic view depicting connections of FIGS. 10 to 12.

The widening of PTI regions is not limited to transistors having a short gate width, such as the transistors QP4 and QN4. FIGS. 10 to 12 are plan views together illustrating another element isolation technique according to a second preferred embodiment of the present invention. FIG. 13 is a schematic view depicting connections of FIGS. 10 to 12. FIGS. 10 and 11 are connected along an imaginary line III-III, and FIGS. 11 and 12 along an imaginary line IV-IV, to form the whole of the plan views.

The PTI regions in FIGS. 1 to 3 are widened with respect to the Y direction in FIGS. 10 to 12. Namely, the N-type impurity regions N17, N18 and the P-type impurity regions P17, P18 formed in PTI regions in FIG. 1 are replaced with an N-type impurity region N101 and a P-type impurity region P101, respectively. The N-type impurity region N19 and the P-type impurity region P19 are replaced with an N-type impurity region N102 and a P-type impurity region P102, respectively (see FIG. 10). The N-type impurity regions N26, N27 and the P-type impurity regions P26, P27 formed in PTI regions in FIG. 2 are replaced with an N-type impurity region N20 and a P-type impurity region P20, respectively. The N-type impurity region N34 and the P-type impurity region P34 are replaced with an N-type impurity region N30 and a P-type impurity region P30, respectively (see FIG. 11). The N-type impurity region N44 and the P-type impurity region P44 formed in PTI regions in FIG. 3 are replaced with an N-type impurity region N40 and a P-type impurity region P40, respectively (see FIG. 12).

All of the N-type impurity regions N101, N102, N20, N30, N40 and the P-type impurity regions P101, P102, P20, P30, P40 are provided between the element isolation insulating layer 103 and the insulating layer 102 of the SOI substrate (see FIGS. 5 to 8) in PTI regions. Since all of the N-type impurity regions N14, N15, N16, N24, N25, N33 and N43 serving as body regions are connected to the high potential line VDL in order to fix the body potentials of the transistors QP1 to QP4, PTI regions may be formed in the whole area between these N-type impurity regions and the main line of the high potential line VDL, to provide the N-type impurity regions therein. However, in order to reduce the junction capacitances of the N-type impurity regions N14, N15, N16, N24, N25, N33 and N43, it is desirable to form PTI regions only near the N-type impurity regions, and separate the PTI regions from the P-type impurity layers serving as source regions or drain regions in positions away from the N-type impurity regions.

More specifically, the width with respect to the Y direction of the PTI region in contact with the body region is extended by a minimum permissible width in a design rule from the ends of the body region to the source and drain regions, as described above. Alternatively, the width with respect to the Y direction of the PTI region should be extended at a distance of a minimum permissible width in a design rule in the X direction from the source and drain regions.

In addition, an FTI region should be employed in positions where the branch lines of the high potential line VDL and the low potential line VSL are provided, thereby substantially avoiding an increase in parasitic capacitance of the branch lines of the high potential line VDL and the low potential line VSL.

Figure 14:
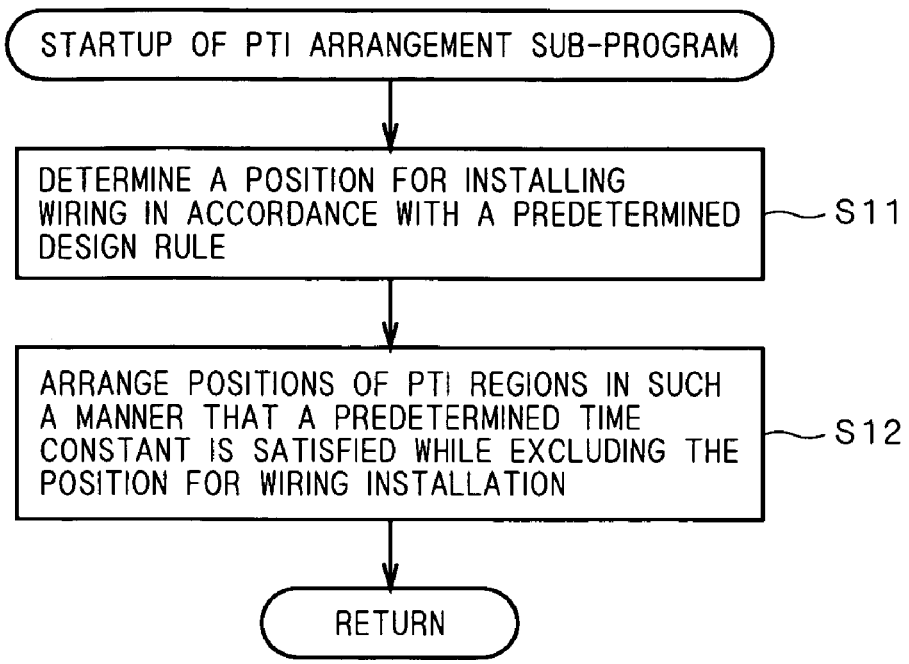
FIG. 14 is a flowchart giving a general outline of a PTI arrangement sub-program.

FIG. 14 is a flowchart giving a general outline of a PTI arrangement sub-program for determining the arrangement of PTI regions. Upon startup of this sub-program from a main routine (not shown) of an arrangement/wiring program of a semiconductor device, steps S11 and S12 are executed in this order, and processing then returns to the main routine.

At step S11, a position for installing wiring is determined in accordance with a predetermined design rule. At step S12, positions of PTI regions are determined while excluding the position for wiring installation determined at step S11. As described above, the PTI regions are arranged in such a manner that a time constant, which is determined by the resistance and capacitance of impurity layers formed in the PTI regions and the resistance and capacitance of gate electrodes, satisfies a predetermined value.

Third Preferred Embodiment

An LSI (large scale integrated circuit) is often designed and manufactured by being divided into a plurality of blocks. For example, the design and manufacture are often conducted by mixing a block (hereafter called a "Type I block") forming a circuit of relatively low degree of design freedom such as a cell base and a gate array used to form a logic circuit, and a block (hereafter called a "Type II block") forming a circuit of relatively high degree of design freedom such as a SRAM (static RAM), a PLL (phase locked loop), an ADC (analog/digital converter), a DAC (digital/analog converter) and an I/O (input/output circuit). This applies to when designing and manufacturing an LSI on an SOI substrate as well.

When designing and manufacturing an LSI on an SOI substrate, it is better to apply the technique of limiting PTI regions to predetermined regions as in the present invention to the Type I block having the lower degree of design freedom than the Type II block. This is because, while the Type II block has a degree of design freedom that allows new optimization to be performed easily when an improved operating frequency presents such problems as parasitic capacitance and diffusion capacitance, those problems can be addressed more easily in the Type I block with the PTI regions being limited to predetermined regions while using conventional design assets.

Accordingly, a conventional element isolation technique is employed in the Type II block by employing only the PTI structure for element isolation, and the techniques described in the first and second preferred embodiments are employed in the Type I block by limiting PTI regions to predetermined regions, for example, thereby improving the operation of the LSI.

Figure 15:
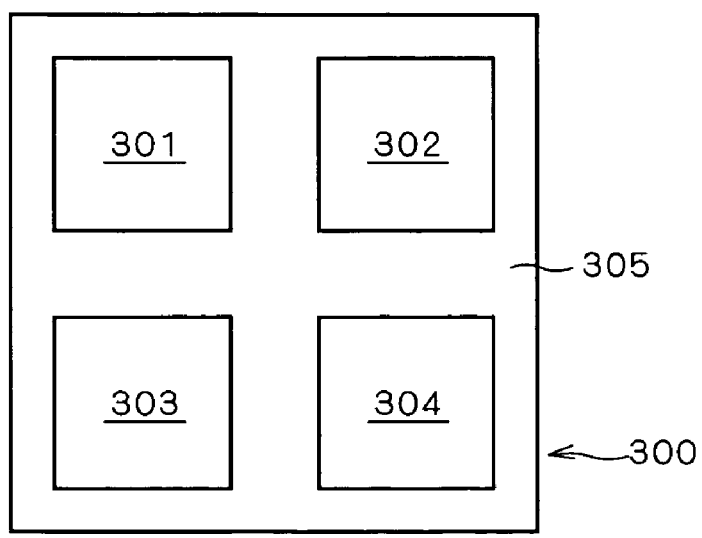
FIG. 15 is a block diagram schematically illustrating an isolation technique according to a third preferred embodiment of the present invention.

FIG. 15 is a block diagram schematically illustrating the structure of an LSI 300 that is designed and manufactured on an SOI substrate. The LSI 300 includes Type I blocks 302, 303, Type II blocks 301, 304 and an FTI region 305 isolating the blocks 301 to 304 from one another.

Even when wiring for interconnecting the blocks (hereafter called "interblock wiring") is provided, the isolation of the blocks 301 to 304 from one another by the FTI region 305 only results in small parasitic capacitance of the interblock wiring. The interblock wiring is actualized in the third or higher wiring from the SOI substrate side.

An FTI region may be formed only in a region where the interblock wiring that presents a particular problem of its parasitic capacitance (when a time constant that increases with an increase in parasitic capacitance is great in view of the operating frequency, for example) is arranged, and a PTI region may be formed in the remaining region. With this, the parasitic capacitance can be reduced with respect to the interblock wiring that presents a parasitic capacitance problem. In addition, the impurity layers provided in the PTI region are connected to the outside of the blocks, which allows the body potentials to be easily fixed. If the whole interblock wiring presents a parasitic capacitance problem, then a PTI region may be provided except the position where the interblock wiring is installed.

Figure 16:
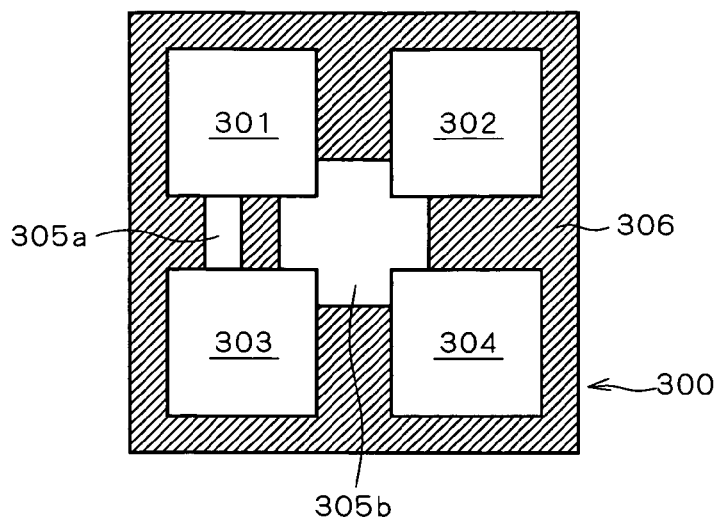
FIG. 16 is a block diagram schematically illustrating an isolation technique according to a modification to the third preferred embodiment.

FIG. 16 is a block diagram illustrating a modification to the third preferred embodiment. In the LSI 300, the blocks 301 to 304 are isolated from one another by FTI regions 305a, 305b and a PTI region 306.

The FTI region 305a includes a region where interblock wiring for interconnecting the blocks 301 and 303 is provided, and the FTI region 305b includes a region where interblock wiring for interconnecting the blocks 302 and 303, or further the blocks 301 and 304, is provided.

Figure 17:
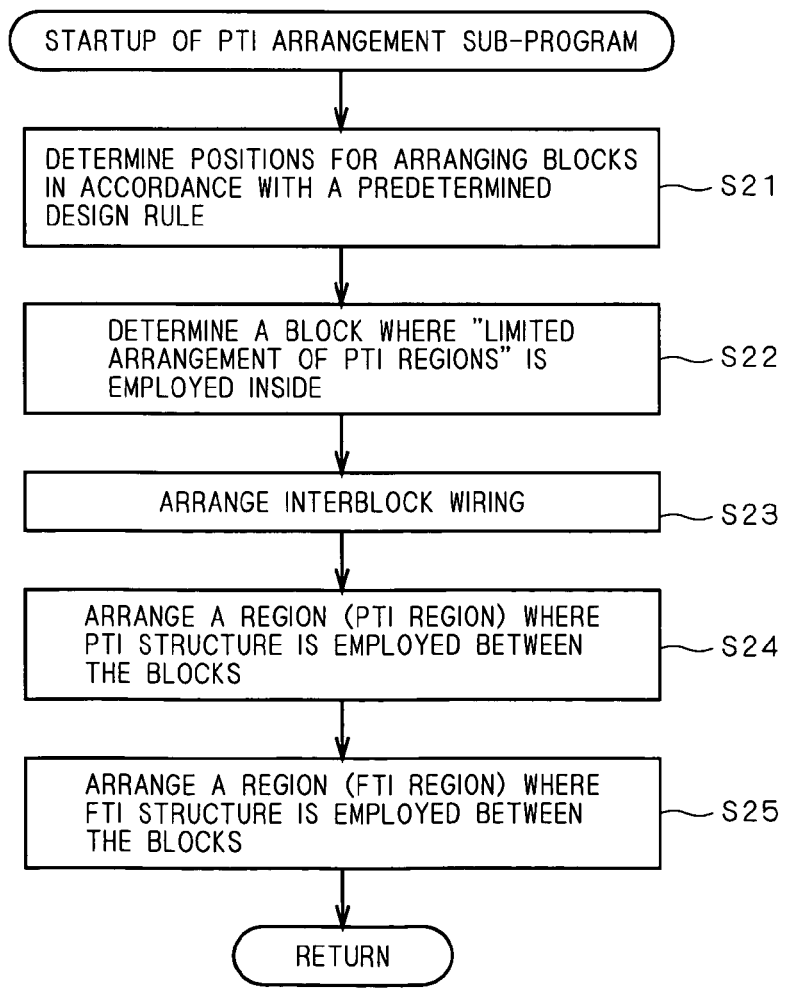
FIG. 17 is a flowchart giving a general outline of a PTI arrangement sub-program.

FIG. 17 is a flowchart giving a general outline of a PTI arrangement sub-program for determining the arrangement of PTI and FTI structures to isolate the blocks. Upon startup of this sub-program from a main routine (not shown) of an arrangement/wiring program of a semiconductor device, steps S21 to S25 are executed in this order, and processing then returns to the main routine. The steps S21 and S22 may be executed in a reversed order, and the steps S24 and S25 may be may be executed in a reversed order.

At step S21, positions for arranging the blocks are determined in accordance with a predetermined design rule. At step S22, it is determined which one of the blocks will receive the element isolation (which is referred to as "limited arrangement of PTI regions" in FIG. 17) illustrated in the first and second preferred embodiments according to the present invention in isolating the elements inside the blocks. At step S23, the arrangement of the interblock wiring is determined. At step S24, the PTI regions between the blocks are determined.

At step S24, considering the position where the interblock wiring is installed determined at step S23, PTI regions may be formed between the blocks excluding the position of the wiring that presents a parasitic capacitance problem. The example of this is illustrated in FIG. 16. Alternatively, a determination can be made at step S24 that no PTI region is employed without considering the position where the inter-block wiring is installed determined at step S23. At step S25, FTI regions are provided in regions between the blocks where the PTI structure is not employed.

When changing the sequence of steps S24 and S25, the execution may be that FTI regions are provided to include the region where the wiring that presents a parasitic capacitance problem is installed, and then PTI regions are provided in regions between the blocks where the FTI structure is not employed at step S25.

Fourth Preferred Embodiment

A method of manufacturing the semiconductor devices according to the first and second preferred embodiments will be described in a fourth preferred embodiment of the present invention.

FIGS. 18 to 25 are cross-sectional views taken along the positions 7-7' in FIG. 1, with the 7' side being extended to the vicinity of the PMOS transistor QP1. The steps of the manufacturing method according to this preferred embodiment are illustrated in these drawings.

Figure 18:
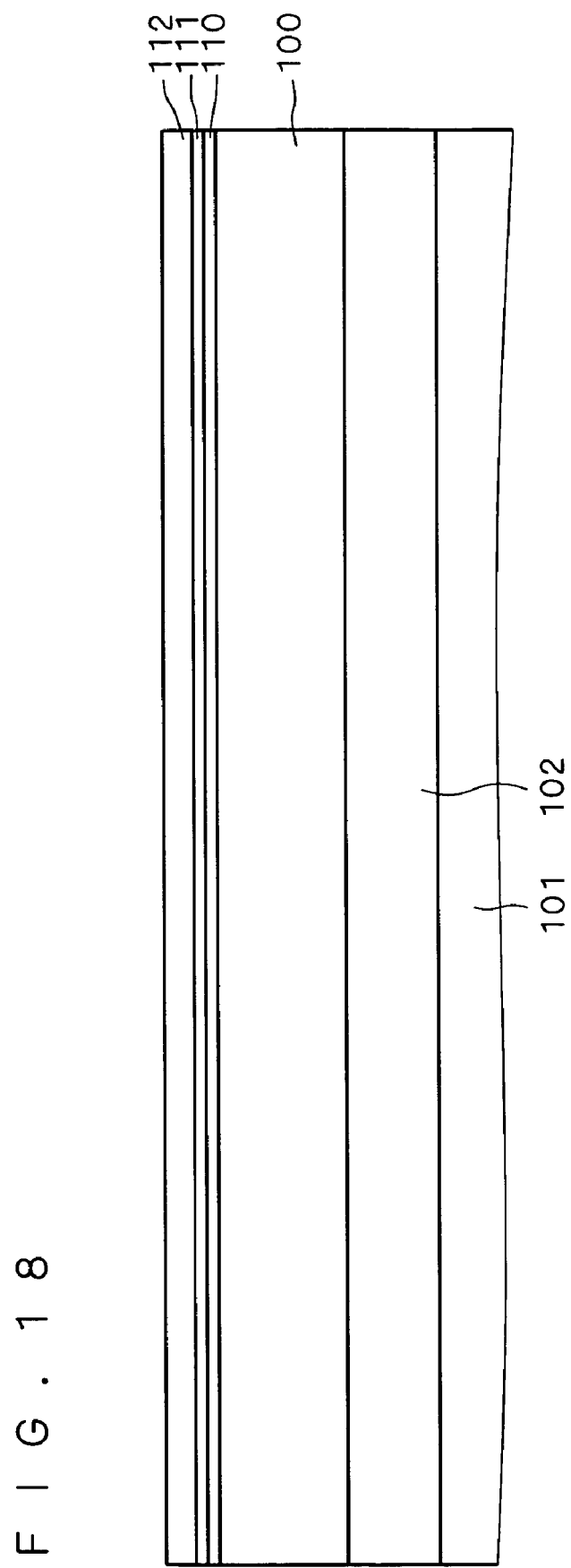
FIGS. 18 to 25 are cross-sectional views illustrating the steps of a method of manufacturing a semiconductor device according to a fourth preferred embodiment of the present invention.

First, a semiconductor substrate (SOI substrate) 101 is prepared that includes an insulating layer 102, which is a buried insulating film such as a silicon oxide film, and an SOI layer 100, which is a semiconductor layer provided on the insulating layer 102. Then, a base oxide film 110, a polysilicon film 111 and a silicon nitride film 112 are formed in this order on the SOI layer 100 (FIG. 18). The base oxide film 110 may be formed by oxidizing the surface of the SOI layer 100 by thermal oxidation, for example. The polysilicon film 111 and the silicon nitride film 112 may be formed by CVD (chemical vapor deposition) and the like. By way of example, the base oxide film 110 is 11 nm, the polysilicon film 111 is 50 nm, and the silicon nitride film 112 is 120 nm in thickness.

Figure 19:
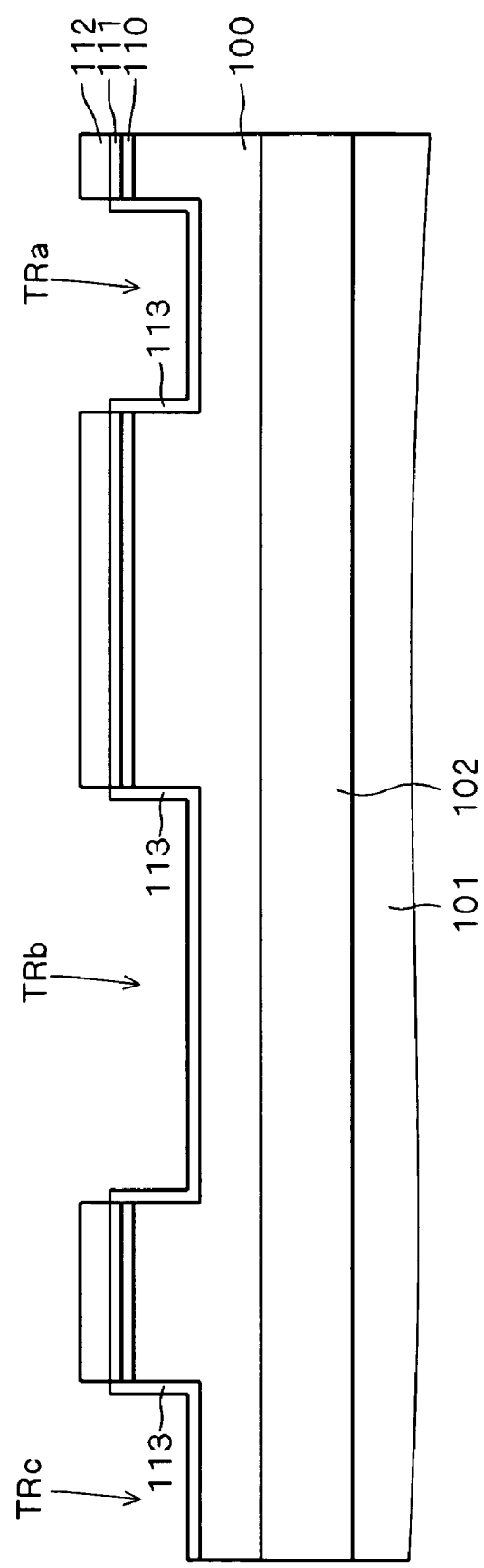

Next, the silicon nitride film 112 is patterned by a photolithography technique. Regions where the element isolation insulating film 103 is to be formed are opened as a result of this patterning. The polysilicon film 111 and the base oxide film 110 are then etched with the patterned silicon nitride film 112 as a mask. Further, the SOI layer 100 is etched to a depth that does not reach the insulating layer 102 with the patterned silicon nitride film 112 as a mask. The silicon nitride film 112 can function as a mask by using the etching selectivity between the silicon nitride film 112, and the polysilicon film 111 and the base oxide film 110, the SOI layer 100. Consequently, trench-shaped portions TRa to TRc are formed. The inner walls of the trench-shaped portions TRa to TRc are then oxidized by thermal oxidation, for example, to form an inner wall oxide film 113 (FIG. 19). The depth of the trench-shaped portions TRa to TRc should be set almost to the same as the element isolation insulating film 103 in a PTI region (90 nm, for example).

Figure 20:
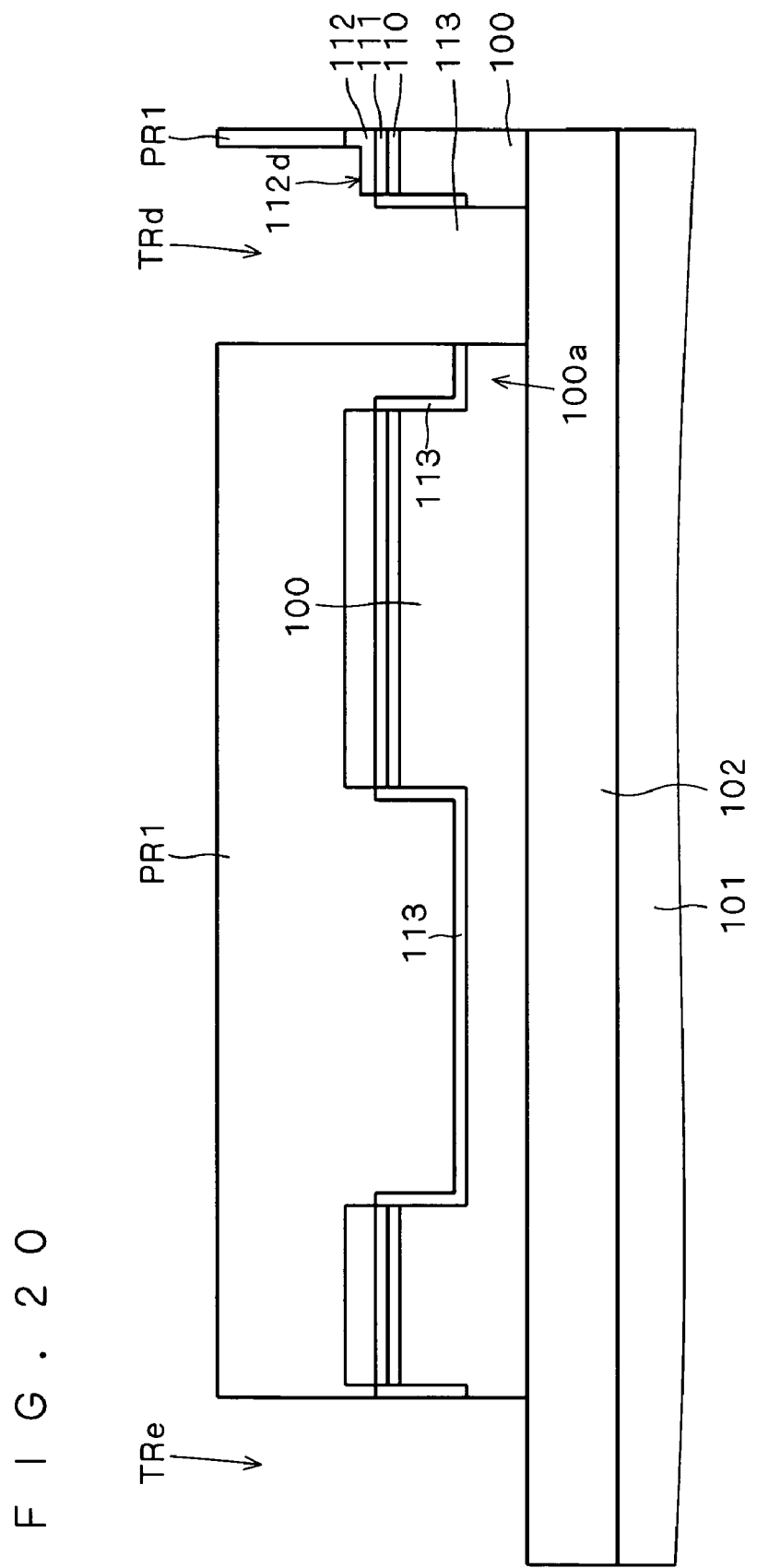

Processing then continues with formation of a photoresist PR1 on the patterned silicon nitride film 112 and above the etched SOI layer 100, and subsequent patterning of the photoresist PR1. Regions where the element isolation insulating film 103 is to be formed in FTI regions are opened as a result of this patterning. Then, trench-shaped portions TRd and TRe, which are part of the etched SOI layer 100, are further etched to a depth that reaches the insulating layer 102, with the patterned photoresist PR1 and silicon nitride film 112 as a mask (FIG. 20).

Both of the photoresist PR1 and the silicon nitride film 112 function as a mask during this etching. Accordingly, even when patterning misalignment of the photoresist PR1 occurs as illustrated in FIG. 20, an exposed portion 112d of the silicon nitride film 112 serves as a mask, preventing the FTI regions from being accidentally expanded. Although being generated partly in the FTI region, a PTI region 100a, which is very small, presents no particular problem.

Figure 21:
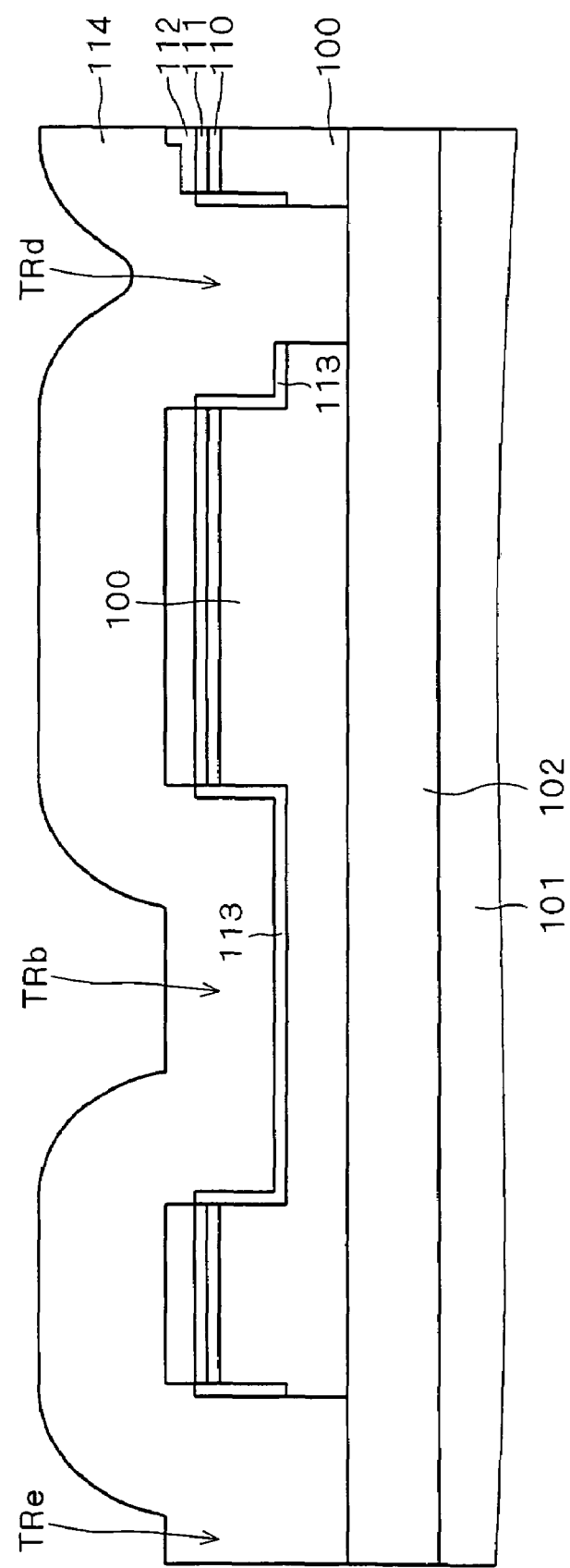
Figure 22:
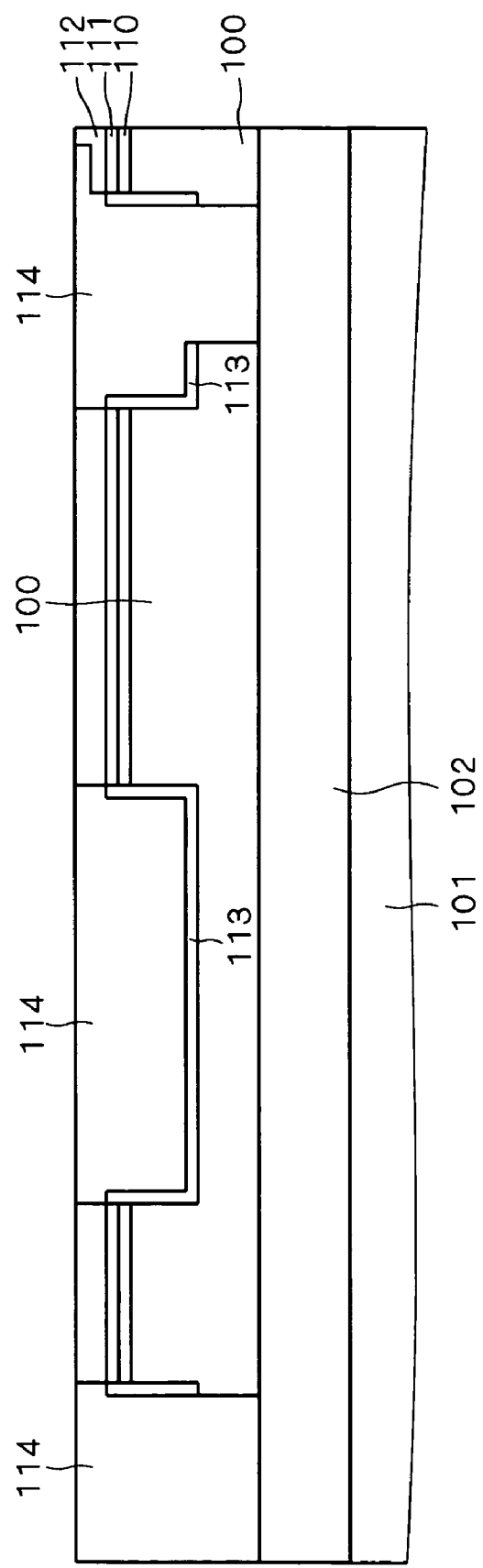

Thereafter, an insulating film 114 such as a silicon oxide film is buried both in the portion of the SOI layer 100 having been etched to a depth that does not reach the insulating layer 102 and in the portion having been etched to a depth that reaches the insulating layer 102, to form the element isolation insulating film 103. More specifically, as illustrated in FIG. 21, the insulating film 114 is formed to cover the trench-shaped portions TRb, TRd, TRe and the silicon nitride film 112 by CVD and the like, and as illustrated in FIG. 22, the surface of the insulating film 114 is planarized by CMP (chemical mechanical polishing) and the like. The silicon nitride film 112 may be used as a polishing stopper during this planarizing process.

Figure 23:
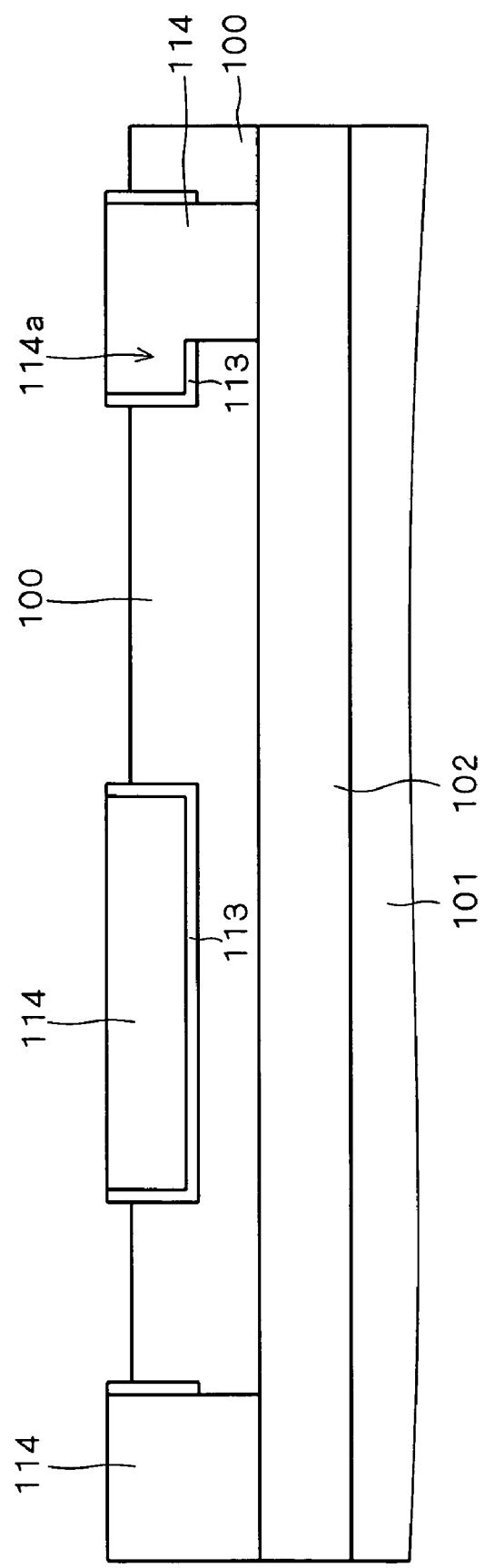
Figure 24:
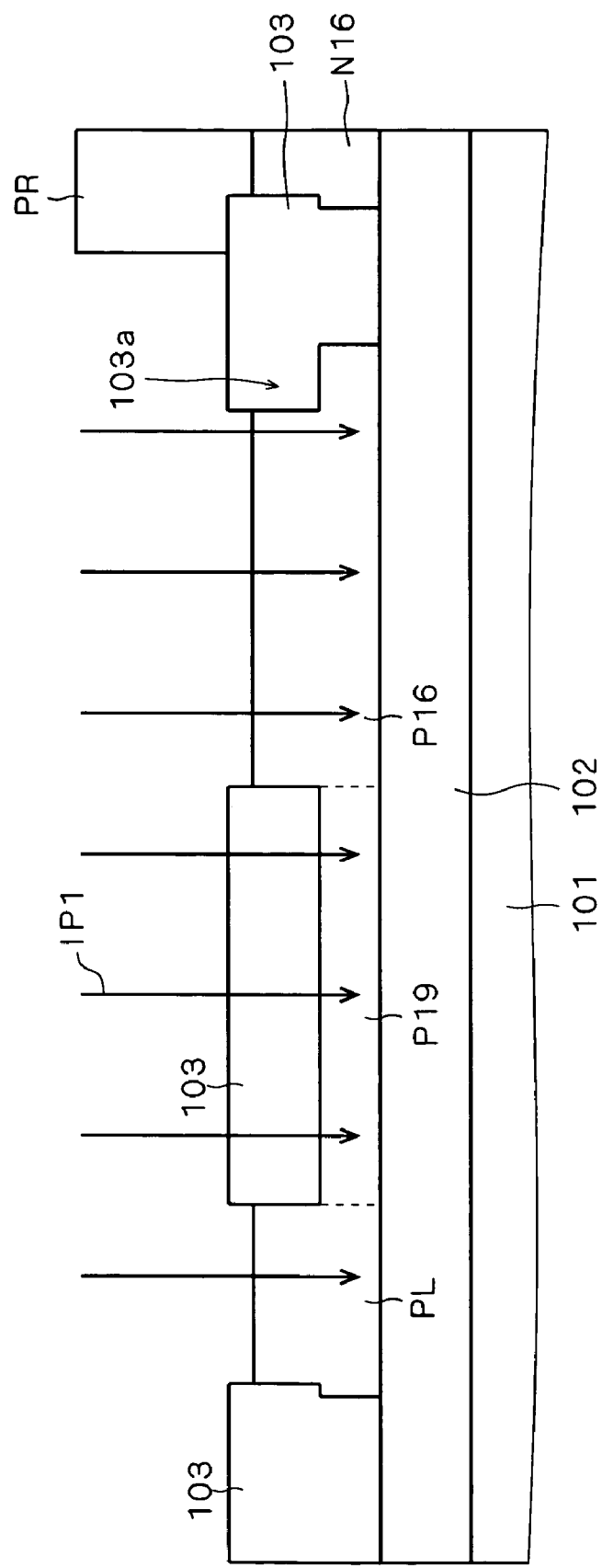
Figure 25:
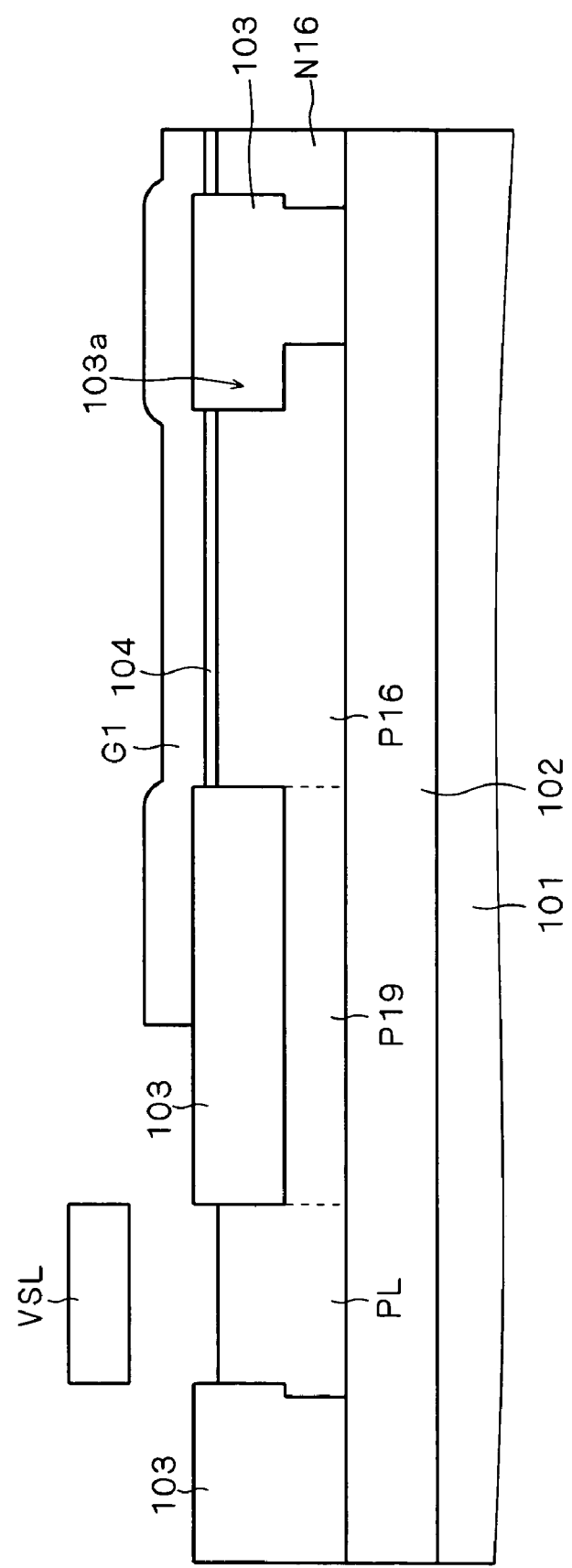

Next, as illustrated in FIG. 23, the silicon nitride film 112, the polysilicon film 111 and the base oxide film 110 are removed by etching, and as illustrated in FIG. 24, selective ion implantation IP1 is performed using a photoresist PR, to form the P-type impurity regions P19, PL, P16 and the like. The N-type impurity regions N16 and the like are formed by the same selective ion implantation. The insulating film 114 and the inner wall oxide film 113 form the element isolation insulating film 103. A partial element isolation insulating film 103a in the FTI region forms the PTI region.

Processing then continues with formation of the gate insulating film 104 of the MIS transistor, the gate electrode G1, the low potential line VSL, the high potential line VDL and the like on the SOI layer 100, thereby completing the semiconductor devices according to the first and second preferred embodiments.

In the method of manufacturing the semiconductor device according to the fourth preferred embodiment, the SOI layer 100 is etched to a depth that does not reach the insulating layer 102 with the silicon nitride film 112 as a mask, and then the trench-shaped portions TRd and TRe, which are part of the etched SOI layer 100, are further etched to a depth that reaches the insulating layer 102 with the photoresist PR1 and the silicon nitride film 112 as a mask. Then, the insulating film 114 is buried in the etched portions to form the element isolation insulating film 103. As a result, the element isolation insulating film 103 that does not reach the insulating layer 102 and the element isolation insulating film 103 that reaches the insulating layer 102 are formed. In addition, since both of the photoresist PR1 and the silicon nitride film 112 are used as a mask during the etching to a depth that reaches the insulating layer 102, the element isolation insulating film 103 that reaches the insulating layer 102 will not be accidentally expanded even when patterning misalignment of the photoresist PR1 occurs.

Further, the element isolation insulating film 103 that reaches the insulating layer 102 is an element isolation insulating film between different transistors, and the element isolation insulating film 103 that does not reach the insulating layer 102 is an element isolation insulating film provided near the P-type impurity regions P16 and the like serving as body regions of the plurality of MIS transistors. Therefore, the semiconductor devices described in the first and second preferred embodiments can be formed.

Fifth Preferred Embodiment

A fifth preferred embodiment of the present invention is a modification to the first preferred embodiment by further providing a plurality of high potential lines and a plurality of low potential lines, to connect a body region to one of the high potential lines and low potential lines in each MIS transistor by an impurity layer in a PTI region.

Figure 26:
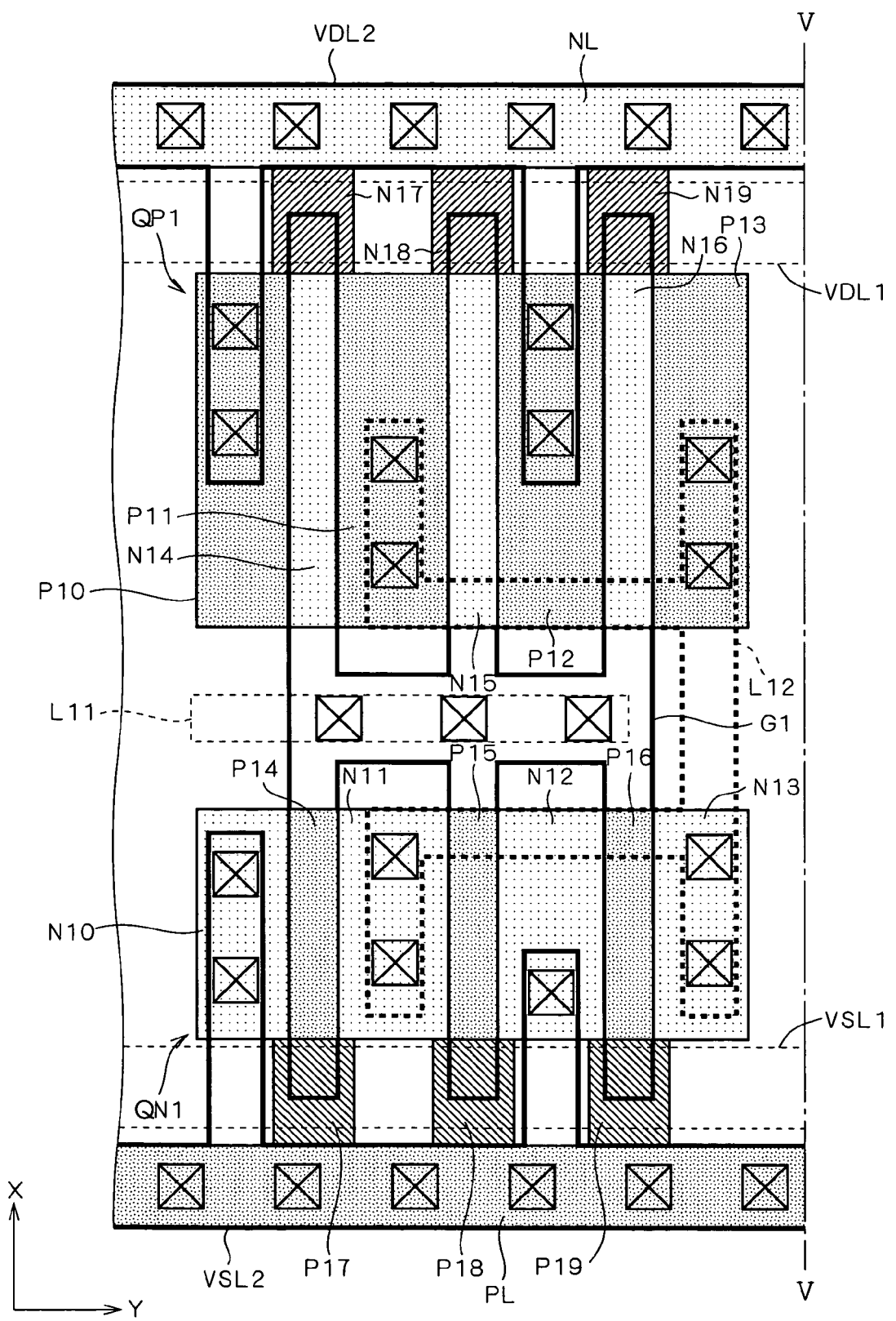
FIG. 26 is a plan view illustrating, together with FIGS. 27 and 28, an element isolation technique according to a fifth preferred embodiment of the present invention.
Figure 28:
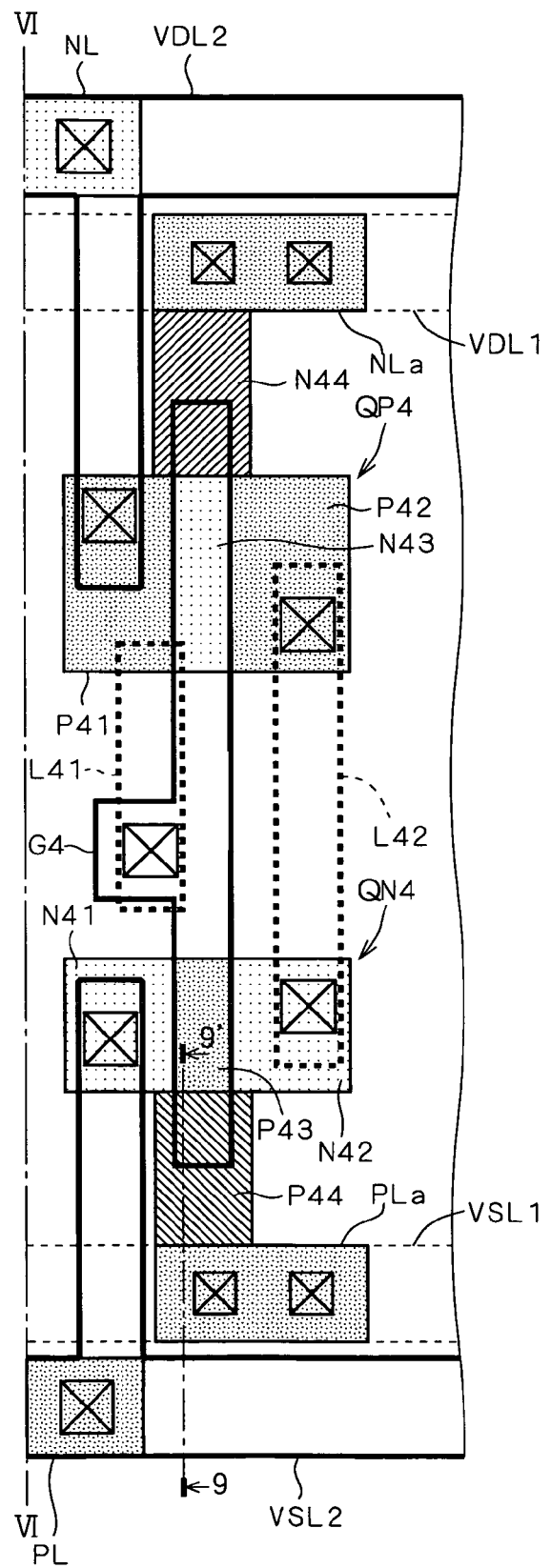
FIG. 28 is a plan view illustrating, together with FIGS. 26 and 27, the element isolation technique according to the fifth preferred embodiment.
Figure 29:
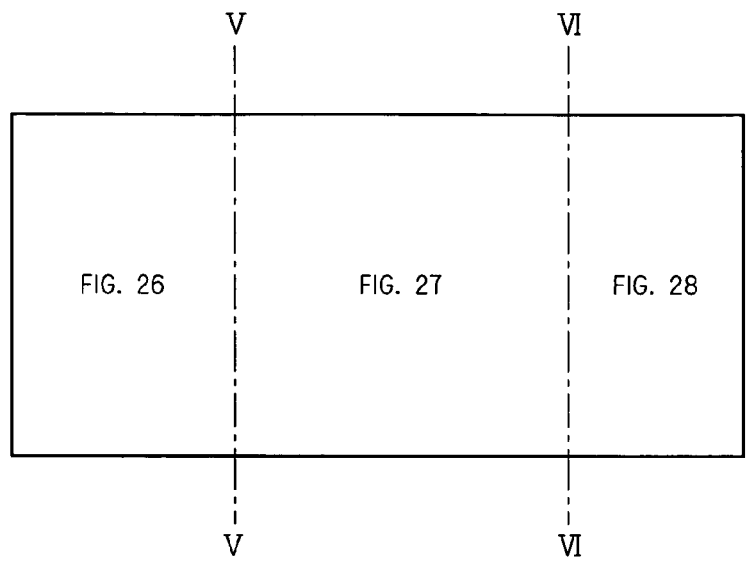
FIG. 29 is a schematic view depicting connections of FIGS. 26 to 28.
Figure 30:
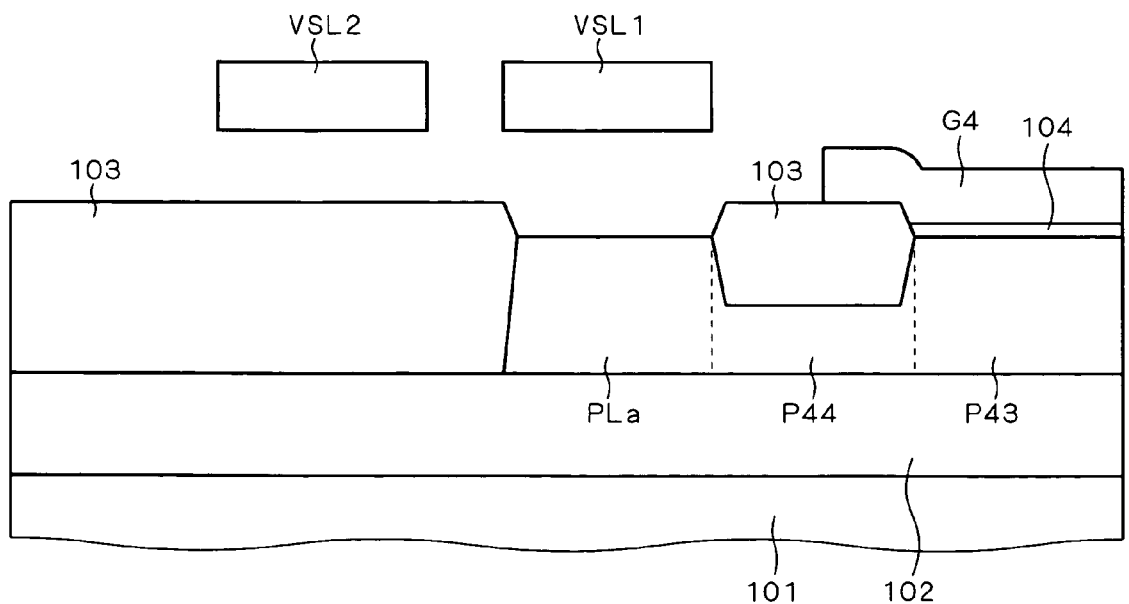
FIG. 30 is a cross-sectional view taken along positions 9-9' in FIG. 28.

FIGS. 26 to 28 are plan views together illustrating an element isolation technique according to the fifth preferred embodiment. FIG. 29 is a schematic view depicting connections of FIGS. 26 to 28. FIGS. 26 and 27 are connected along an imaginary line V-V, and FIGS. 27 and 28 along an imaginary line VI-VI, to form the whole of the plan views. FIG. 30 is a cross-sectional view taken along positions 9-9' in FIG. 28. The left and right ends of FIG. 30 correspond to the positions 9 and 9' in FIG. 28.

As illustrated in FIGS. 26 to 30, the semiconductor device according to the fifth preferred embodiment includes, instead of the high potential line VDL and the low potential line VSL in FIGS. 1 to 3, a plurality of high potential lines VDL1 and VDL2 applied with different high potentials, and a plurality of low potential lines VSL1 and VSL2 applied with different low potentials, the low potentials being lower than any of the different high potentials.

Each of the low potential line VSL2 and the high potential line VDL2 includes a main line extending along the direction (positive direction of the Y direction) from left to right in FIGS. 26 to 28, and a branch line extending along the X direction. Each of the low potential line VSL1 and the high potential line VDL1 includes a main line extending along the direction (positive direction of the Y direction) from left to right in FIGS. 26 to 28.

The P-type impurity layer PL and the N-type impurity layer NL are formed in positions where the main line of the low potential line VSL2 is provided and the main line of the high potential line VDL2 is provided, respectively, in the SOI substrate. The main line of the low potential line VSL2 is connected to the P-type impurity layer PL, and the main line of the high potential line VDL2 to the N-type impurity layer NL, respectively, via contact holes. In addition, a P-type impurity layer PLa and an N-type impurity layer NLa are formed near the PMOS transistor QP4 in a position where the main line of the low potential line VSL1 is provided and near the NMOS transistor QN4 in a position where the main line of the high potential line VDL1 is provided, respectively, in the SOI substrate. The main line of the low potential line VSL1 is connected to the P-type impurity layer PLa, and the main line of the high potential line VDL1 to the N-type impurity layer NLa, respectively, via contact holes. Although being indicated by dashed lines in FIGS. 26 to 28, the high potential line VDL1 and the low potential line VSL1 exist in the same wiring layer as the high potential line VDL2 and the low potential line VSL2, as illustrated in FIG. 30.

As shown in FIGS. 26 to 28, the N-type and P-type impurity layers provided in PTI regions of the SOI layer each have the function of connecting a body region to one of the high potential lines VDL1, VDL2 and the low potential lines VSL1, VSL2 in each of the plurality of MIS transistors.

Namely, in FIGS. 26 and 27, the N-type impurity layers N17 to N19, N26, N27, N34 and the P-type impurity layers P17 to P19, P26, P27, P34 are provided in PTI regions of the SOI layer. The N-type impurity layers N17, N18 and N19 have the function of connecting the body regions of the PMOS transistor QP1 to the high potential line VDL2, the N-type impurity layers N26 and N27 have the function of connecting the body regions of the PMOS transistor QP2 to the high potential line VDL2, and the N-type impurity layer N34 has the function of connecting the body region of the PMOS transistor QP3 to the high potential line VDL2, respectively. Likewise, the P-type impurity layers P17, P18 and P19 have the function of connecting the body regions of the NMOS transistor QN1 to the low potential line VSL2, the P-type impurity layers P26 and P27 have the function of connecting the body regions of the NMOS transistor QN2 to the low potential line VSL2, and the P-type impurity layer P34 has the function of connecting the body region of the NMOS transistor QN3 to the low potential line VSL2, respectively.

Likewise, in FIG. 28, the N-type impurity layer N44 and the P-type impurity layer P44 are provided in PTI regions of the SOI layer. The N-type impurity layer N44 makes contact with the N-type impurity layers N43, NLa and the P-type impurity layers P41, P42. Accordingly, the N-type impurity layer N44 has the function of connecting the body region of the PMOS transistor QP4 to the high potential line VDL1. Meanwhile, the P-type impurity layer P44 makes contact with the P-type impurity layers P43, PLa and the N-type impurity layers N41, N42. Accordingly, the P-type impurity layer P44 has the function of connecting the body region of the NMOS transistor QN4 to the low potential line VSL1.

In the semiconductor device according to the fifth preferred embodiment, the N-type and P-type impurity layers provided in PTI regions of the SOI layer each have the function of connecting a body region to one of the high potential lines VDL1, VDL2, and the low potential lines VSL1, VSL2 in each of the plurality of MIS transistors. This allows various potentials to be applied to the respective bodies of the plurality of MIS transistors.

The technical concept according to the fifth preferred embodiment may be applied to the second preferred embodiment.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a plurality of MIS transistors located in a semiconductor layer provided on an insulating layer, said MIS transistors each including at least one gate electrode, a first semiconductor region of a first conductivity type, a second semiconductor region of a first conductivity type and a third semiconductor region of a second conductivity type which is opposite to a first conductivity type interposed between said first semiconductor region and said second semiconductor region, said first semiconductor and said second semiconductor regions being located on both sides of said gate electrode in a gate length direction and each reaching said insulating layer; and
a first-element isolation insulating film located in said semiconductor layer and reaching said insulating layer, wherein
said first element isolation insulating film abuts on said first semiconductor region and said second semiconductor region and isolates MIS transistors of the same conductivity type from one another;
said semiconductor device further comprising,
a second element isolation insulating film located in said semiconductor layer, and a fourth semiconductor region of a second conductivity type being provided between said second element isolation insulating film and said insulating layer.

2. The semiconductor device according to claim 1, wherein said second element isolation insulating film abuts on said third semiconductor region.

3. The semiconductor device according to claim 2, wherein said gate electrode has a sidewall formed on both side surfaces thereof along an extending direction, said first semiconductor region and said second semiconductor region include a semiconductor part in a position facing said sidewall, and said second element isolation insulating film abutting on said third semiconductor region has a width along gate length direction, said width being set from the end of one said sidewall on the opposite side to said gate electrode to reach the end of the other said sidewall on the opposite side to said gate electrode via said gate electrode along said gate length direction.

4. The semiconductor device according to claim 2, wherein said second element isolation insulating film in a position abutting on said third semiconductor region has a width along said gate length direction, said width being extended by a minimum permissible width in a design rule from one end of said third semiconductor region toward said first semiconductor region and from the other end toward said second semiconductor region.

5. The semiconductor device according to claim 4, wherein said second element isolation insulating film has a width along said gate length direction, said width being widened beyond a minimum permissible distance in a design rule in an extending direction of said gate electrode from said first semiconductor region and said second semiconductor region.

6. A semiconductor integrated circuit comprising:
a Type I block forming a circuit that includes the semiconductor device recited in claim 1;
a Type II block forming another circuit; and
an isolation region isolating said blocks,
said semiconductor integrated circuit being formed in said semiconductor layer provided on said insulating layer,
wherein an isolation insulating film isolating blocks reaches said insulating layer at least in a position where interblock wiring for interconnecting said blocks is installed.

7. The semiconductor integrated circuit according to claim 6, wherein
said isolation insulating film does not reach said insulating layer except said position where said interblock wiring is installed.

8. The semiconductor integrated circuit according to claim 6, wherein
the whole of said isolation insulating film isolating said blocks reaches said insulating layer.

9. The semiconductor device according to claim 2, further comprising:
a plurality of high potential lines applied with different high potentials; and
a plurality of low potential lines applied with different low potentials, said low potentials being lower than any of said different high potentials,
wherein said fourth semiconductor region connects said third semiconductor region to one of said high potential lines and said low potential lines in each of said plurality of MIS transistors.

* * * * *